US009627072B2

(12) United States Patent
Chang et al.

(10) Patent No.: US 9,627,072 B2
(45) Date of Patent: Apr. 18, 2017

(54) VARIANT OPERATION SEQUENCES FOR MULTIBIT MEMORY

(71) Applicant: MACRONIX INTERNATIONAL CO., LTD., Hsinchu (TW)

(72) Inventors: Yu-Ming Chang, Pingtung (TW); Yung-Chun Li, New Taipei (TW); Hsiang-Pang Li, Hsinchu (TW); Yuan-Hao Chang, Taipei (TW); Tei-Wei Kuo, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/857,598

(22) Filed: Sep. 17, 2015

(65) Prior Publication Data
US 2016/0148694 A1 May 26, 2016

Related U.S. Application Data

(60) Provisional application No. 62/084,526, filed on Nov. 25, 2014.

(51) Int. Cl.
*G11C 16/10* (2006.01)
*G11C 11/56* (2006.01)
(Continued)

(52) U.S. Cl.
CPC .............. *G11C 16/10* (2013.01); *G11C 11/56* (2013.01); *G11C 11/5628* (2013.01);
(Continued)

(58) Field of Classification Search
None
See application file for complete search history.

(56) References Cited

U.S. PATENT DOCUMENTS 5,404,485 A 4/1995 Ban
5,905,993 A 5/1999 Shinohara
(Continued)

OTHER PUBLICATIONS

Chang, Y.H., et al., "A Reliability Enhancement Design under the Flash Translation Layer for MLC-Based Flash-Memory Storage Systems," ACM Transactions on Embedded Computing Systems (TECS) vol. 13 Issue 1, Aug. 2013, Article No. 10, 28 pages.
(Continued)

*Primary Examiner* — James G Norman
(74) *Attorney, Agent, or Firm* — Haynes Beffel & Wolfeld LLP

(57) ABSTRACT

A multiple-bit-per-cell, page mode memory comprises a plurality of physical pages, each physical page having N addressable pages p(n). Logic implements a plurality of selectable program operations to program an addressed page. Logic select one of the plurality of selectable program operations to program an addressed page in the particular physical page using a signal that indicates a logical status of another addressable page in the particular physical page. The logical status can indicate whether the other addressable page contains invalid data. The first program operation overwrites the other addressable page, and the second program operation preserves the other addressable page. The first program operation can execute more quickly than the second program operation. The logic can also be applied for programming multiple-bit-per-cell memory not configured in a page mode.

29 Claims, 21 Drawing Sheets

(51) Int. Cl.
*G11C 16/08* (2006.01)
*G11C 16/26* (2006.01)
*G11C 16/34* (2006.01)

(52) U.S. Cl.
CPC .......... *G11C 11/5642* (2013.01); *G11C 16/08* (2013.01); *G11C 16/26* (2013.01); *G11C 16/3459* (2013.01); *G11C 2211/5621* (2013.01); *G11C 2211/5641* (2013.01); *G11C 2211/5648* (2013.01)

(56) References Cited

U.S. PATENT DOCUMENTS

| | | | | |
|---|---|---|---|---|
| 7,259,976 B2* | 8/2007 | Lee | ........................... | G11C 8/08 365/185.19 |
| 7,755,945 B2 | 7/2010 | Ho et al. | | |
| 8,094,500 B2* | 1/2012 | Paley | .................. | G06F 12/0246 365/185.11 |
| 2014/0198570 A1 | 7/2014 | Hsieh et al. | | |

OTHER PUBLICATIONS

Chen, C.P., et al., "A Highly Pitch Scalable 3D Vertical Gate (VG) NAND Flash Decoded by a Novel Self-Aligned Independently Controlled Double Gate (IDG) String Select Transistor (SSL)", Hsinchu, Tawain, Symposium on VLSI Technology Digest of Technical Papers, Jun. 12-14, 2012, pp. 91-92.
Cho, H., et al., "KAST: K-associative sector translation for NAND flash memory in real-time systems," Design, Automation & Test in Europe Conference & Exhibition, 2009, Apr. 20-24, 2009, 6 pages.
Cho, Y-S., et al., "Adaptive Multi-Pulse Program Scheme Based on Tunneling Speed Classification for Next Generation Multi-Bit/Cell NAND Flash", IEEE Journal of Solid-State Circuits, vol. 48, No. 4, Apr. 2013, pp. 948-959.
Cho, Y., et al., "Three-Dimensional 128Gb MLC Vertical NAND Flash-Memory with 24-WL Stacked Layers and 50MB/s High-Speed Programming", Samsung Semiconductor, Hwasung, Korea, ISSCC 2014, Feb. 2014, pp. 334-335.
Ghetti, A., et al., "Comprehensive Analysis of Random Telegraph Noise Instability and Its Scaling in Deca-Nanometer Flash Memories", IEEE Transactions on Electron Devices, vol. 56, No. 8, Aug. 2009, pp. 1746-1752.
Grupp, L.M., et al., "Characterizing flash memory: Anomalies, observations, and applications," 42nd Annual IEEE/ACM International Symposium on Microarchitecture, 2009 (MICRO-42), Dec. 12-16, 2009, 10 pages.
Gupta, A., et al., "DFTL: a flash translation layer employing demand-based selective caching of page-level address mappings," ASPLOS XIV, Proceedings of the 14th international conference on Architectural support for programming languages and operating systems, Mar. 7-11, 2009, pp. 229-240.
Im, S., et al., "Flash-Aware RAID Techniques for Dependable and High-Performance Flash Memory SSD", IEEE Transactions on Computers, vol. 60, No. 1, Jan. 2011, pp. 80-92.
Jagmohan, A., et al., "Write Amplification Reduction in NAND Flash Through Multi-Write Coding," IBM T.J. Watson Research Center, 2010 IEEE 26th Symp. on Mass Storage Systems and Technologies (MSST), May 3-7, 2010, 6 pages.
Kim, J. et al., "A Space-Efficient Flash Translation Layer for Compactflash Systems", IEEE Transactions on Consumer Electronics, vol. 48, No. 2, May 2002, pp. 366-375.
Lee, S., et al., "FlexFS: A Flexible Flash File System for MLC NAND Flash Memory", USENIX Annual Technical Conference, San Diego, CA, Jun. 2009, 23 pages.
Lee, S.W., et al., "FAST: An Efficient Flash Translation Layer for Flash Memory", book title: Emerging Directions in embedded and Ubiquitous Computing, EUC 2006 Workshops, Aug. 1-4, 2006, pp. 879-887.
Lu, C.Y, et al., "Future challenges of flash memory technologies," Microelectronic Engineering, vol. 86, Issue 3, Mar. 2009, pp. 283-286.
Park, K.T., et al., "A Zeroing Cell-to-Cell Interference Page Architecture with Temporary LSB Storing and Parallel MSB Program Scheme for MLC NAND Flash Memories", IEEE Journal of Solid-State Circuits, vol. 43, No. 4, Apr. 2008, pp. 919-928.
Park, S.H., et al., "Design and Analysis of Flash Translation Layers for Multi-Channel NAND Flash-based Storage Devices", IEEE Transactions on Consumer Electronics, vol. 55, No. 3, Aug. 2009, pp. 1392-1400.
Qin, Z., et al., "MNFTL: An Efficient Flash Translation Layer for MLC NAND Flash Memory Storage Systems", San Diego, CA, USA, Copyright 2011, DAC'11, Jun. 5-10, 2011 , pp. 17-22.
Shin, S.H., et al., "A New 3-bit Programming Algorithm using SLC-to-TLC Migration for 8MB/s High Performance TLC NAND Flash Memory", 2012 IEEE Symp. on VLSI Circuits Digest of Technical papers, Jun. 13-15, 2012, pp. 132-133.
Shin,Y., "Non-volatile memory technologies for beyond 2010," 2005 Symposium on VLSI Circuits, Digest of Technical Papers, Jun. 16-18, 2005, 4 pages.
Suh, K.D., et al., "A 3.3 V 32 Mb NAND Flash Memory with Incremental Step Pulse Programming Scheme," Solid-State Circuits Conference, 1995. Digest of Technical Papers. 41st ISSCC, Feb. 15-17, 1995 IEEE International, pp. 1149-1156.
Tanaka, H., et al., "Bit Cost Scalable Technology with Punch and Plug Process for Ultra High Density Flash Memory," IEEE Symposium on VLSI Technology, Jun. 12-14, 2007, 2 pages.
U.S. Appl. No. 14/805,498, filed Jul. 22, 2015 by inventors Hsiang-Pang Li, Yuan-Hao Chang and Tei-Wei Kuo, (P1030306), 32 pages.
Wei, Q., et al., "WAFTL: A Workload Adaptive Flash Translation Layer with Data Partition," Singapore, Copyright 2011 IEEE 27th Symp. on Mass Storage Systems and Technologies (MSST), May 23-27, 2011, 12 pages.
Wu, C.H., et al., "An Adaptive Two-Level Management for the Flash Translation Layer in Embedded Systems," IEEE/ACM International Conference on Computer-Aided Design 2006. ICCAD '06, Nov. 5-9, 2006, 6 pages.

* cited by examiner

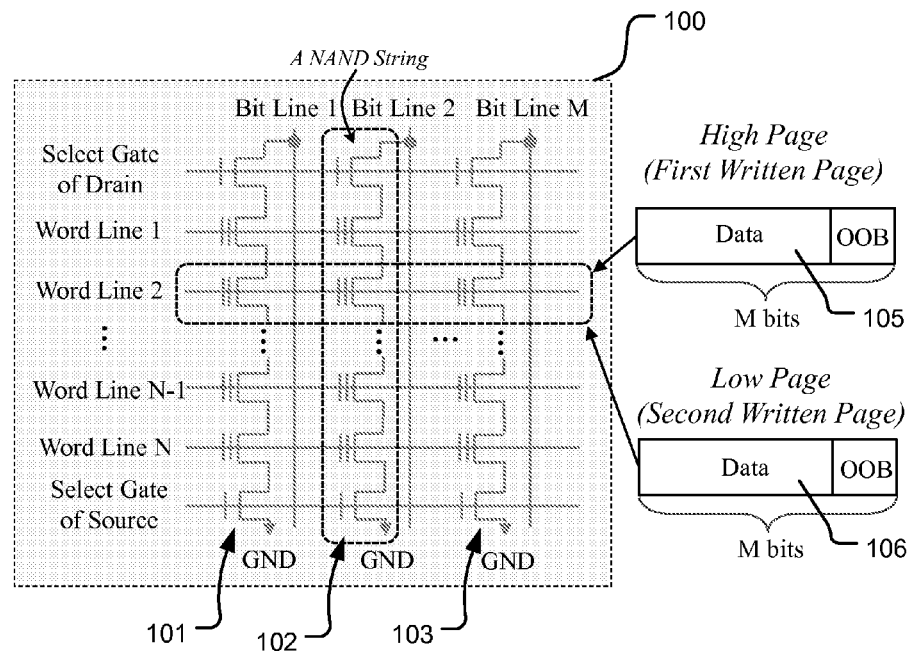
FIG. 2 – PRIOR ART
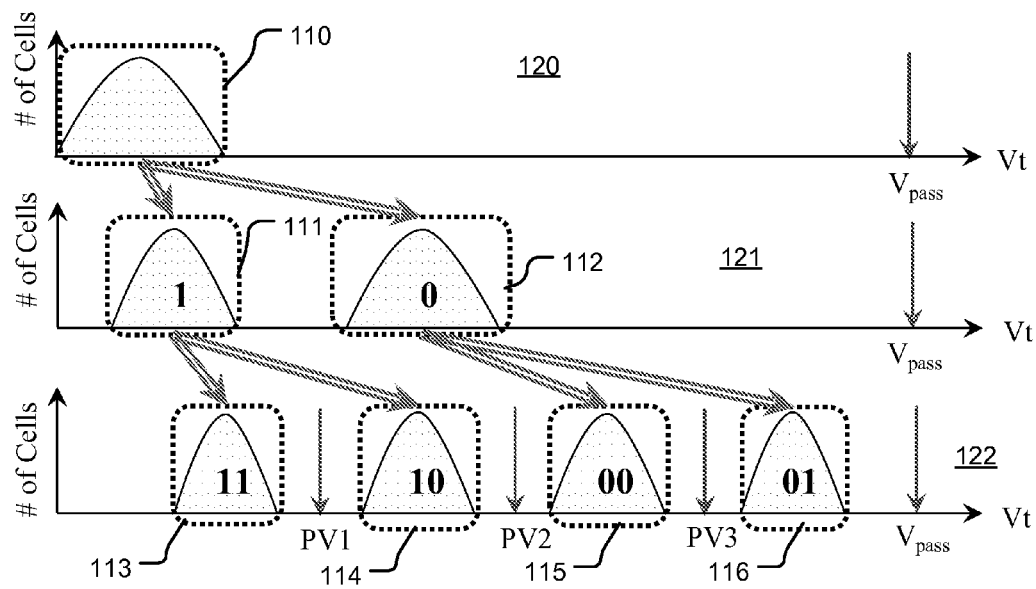
FIG. 3 – PRIOR ART

Logical View of Block 100

Physical View of Block 100

Algorithm 1: STATIC-OPERATION-HANDLER

*Input:* op, addr, data, bitmap, LWPT
*Output:*

1  $pba \leftarrow addr\ /\ \text{PAGEPERBLOCK}$;
2  $ppa \leftarrow addr\ \%\ \text{PAGEPERBLOCK}$;
3  $offset \leftarrow LWPT[pba]$;
4  if $op = \text{WRITE}$ *and* $(ppa - offset) > 1$ then
5  $\quad\quad end = \text{MIN}(ppa - 1, \frac{1}{2}\ \text{PAGEPERBLOCK} - 1)$;
6  $\quad\quad$ for $i = offset + 1$ to $end$ do
7  $\quad\quad\quad\quad \text{TRIM}(bitmap, pba, i, \text{SET})$;

8  if $ppa \geq \frac{1}{2}\ \text{PAGEPERBLOCK}$ then   /* Low Pages */
9  $\quad\quad$ if IS-BIT-SET$(bitmap, pba, ppa - \frac{1}{2}\ \text{PAGEPERBLOCK})$ then
10 $\quad\quad\quad\quad EnableSLC \leftarrow \text{TRUE}$;
11 $\quad\quad$ else
12 $\quad\quad\quad\quad EnableSLC \leftarrow \text{FALSE}$;
13 else                                             /* High Pages */
14 $\quad\quad EnableSLC \leftarrow \text{FALSE}$;

15 if $op = \text{READ}$ then                   /* Read */
16 $\quad\quad \text{READ-PAGE}(pba, ppa, EnableSLC)$;
17 else if $op = \text{WRITE}$ then            /* Write */
18 $\quad\quad \text{WRITE-PAGE}(pba, ppa, data, EnableSLC)$;
19 else if $op = \text{ERASE}$ then            /* Erase */
20 $\quad\quad \text{TRIM}(bitmap, pba, \text{NULL}, \text{RESET})$;
21 $\quad\quad \text{ERASE-BLOCK}(pba)$;
22 else if $op = \text{TRIM}$ then             /* Trim */
23 $\quad\quad$ if $ppa + \frac{1}{2}\ \text{PAGEPERBLOCK} > offset$ then
24 $\quad\quad\quad\quad \text{TRIM}(bitmap, pba, ppa, \text{SET})$;

FIG. 9

Algorithm 2: DYNAMIC-OPERATION-HANDLER

Input: op, addr, data, bitmap, LWPT, LPAT
Output:

1  $pba \leftarrow addr$ / PAGEPERBLOCK;
2  $ppa \leftarrow addr$ % PAGEPERBLOCK;
3  $offset \leftarrow LWPT[pba]$;
4  if $op =$ WRITE and $(ppa - offset) > 1$ then
5      $end \leftarrow$ MIN$(ppa - 1, \frac{1}{2}$ PAGEPERBLOCK $- 1)$;
6      for $i \leftarrow offset + 1$ to $end$ do
7          TRIM$(bitmap, pba, i,$ SET$)$;

8  if $ppa \geq \frac{1}{2}$ PAGEPERBLOCK then     /* Low Pages */
9      $tmp \leftarrow$ MAPPING$(LPAT, pba, ppa)$;
10     if $tmp =$ NULL then
11         $ppa \leftarrow$ ALLOC$(LPAT, bitmap, pba, ppa)$;
12     else
13         $ppa \leftarrow tmp$;
14     if IS-BIT-SET$(bitmap, pba, ppa - \frac{1}{2}$ PAGEPERBLOCK$)$ then
15         $EnableSLC \leftarrow$ TRUE;
16     else
17         $EnableSLC \leftarrow$ FALSE;
18 else     /* High Pages */
19     $EnableSLC \leftarrow$ FALSE;

20 if $op =$ READ then     /* Read */
21     READ-PAGE$(pba, ppa, EnableSLC)$;
22 else if $op =$ WRITE then     /* Write */
23     WRITE-PAGE$(pba, ppa, data, EnableSLC)$;
24 else if $op =$ ERASE then     /* Erase */
25     TRIM$(bitmap, pba,$ NULL, RESET$)$;
26     INIT$(LPAT, pba)$;
27     ERASE-BLOCK$(pba)$;
28 else if $op =$ TRIM then     /* Trim */
29     $IsLowPageProgrammed \leftarrow$ FALSE;
30     for $i \leftarrow \frac{1}{2}$ PAGEPERBLOCK to PAGEPERBLOCK do
31         if $ppa + \frac{1}{2}$ PAGEPERBLOCK $=$ MAPPING$(LPAT, pba, i)$ then
32             $IsLowPageProgrammed \leftarrow$ TRUE;
33             break;

34     if $IsLowPageProgrammed =$ FALSE then
35         TRIM$(bitmap, pba, ppa,$ SET$)$;

FIG. 13

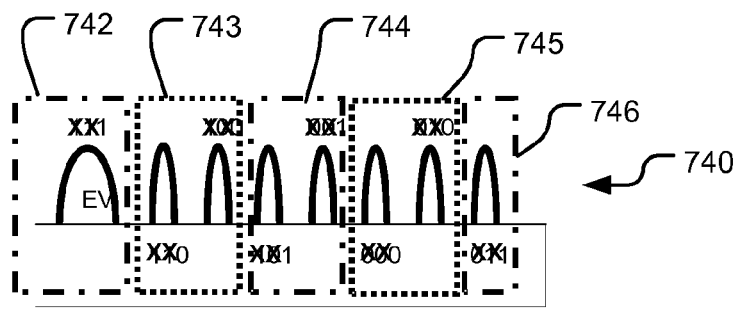
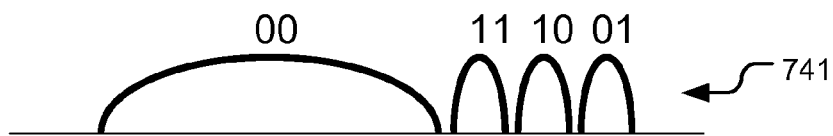
FIG. 23
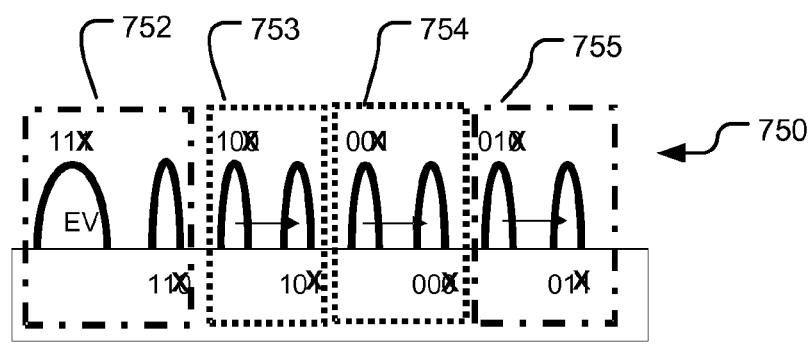
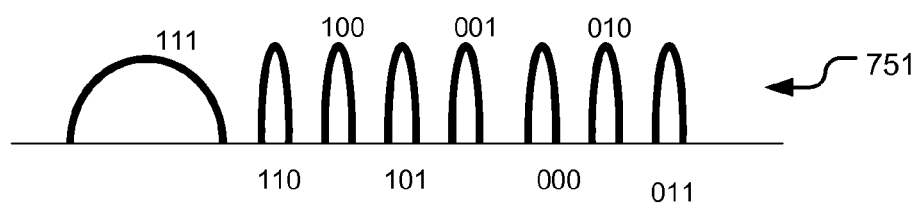
FIG. 24 ized by the voltage range required for
the multiple levels (below Vpass) is partitioned into more
states. Note that Vpass is the voltage that can turn on flash
cells in any data storage state.

VARIANT OPERATION SEQUENCES FOR MULTIBIT MEMORY

RELATED APPLICATIONS

This application claims the benefit of U.S. Provisional Patent Application No. 62/084,526, filed on 25 Nov. 2014, which application is incorporated by reference as if fully set forth herein.

This application is related to commonly owned, co-pending U.S. patent application Ser. No. 14/805,498, filed 22 Jul. 2015 by inventors Yu-Ming Chang, Yung-Chun Li, Hsiang-Pang Li, Yuan-Hao Chang, Tei-Wei Kuo, (P1030306), which application is incorporated by reference as if fully set forth herein.

BACKGROUND

Field of the Technology

The present disclosure relates to high density memory devices, and to the operation of devices storing multiple bits per cell.

Description of Related Art

NAND flash memory is widely adopted as a storage medium for mobile devices, solid-state disks in laptops and servers and for other data processing systems. In order to improve the data density on NAND flash memory chips, vendors have been using multilevel-cell (MLC) technology to store two or more bits of information in each cell. However, MLC chips usually suffer from a longer latency in read and program operations, shorter retention time, and more reliability concerns due to smaller gaps among the threshold voltages of different bit values, compared to single-level-cell (SLC) chips in which each cell stores one bit of information.

In MLC flash memory, programming the high and low pages of the same word line can be divided into two stages, because it is not guaranteed that data of both pages are ready in the page buffer for programming. See, Chang, et al., "A reliability enhancement design under the flash translation layer for mlc-based flash-memory storage systems," ACM Trans. Embed. Comput. Syst. 13(1):10:1-10:28. September 2013. For example, all the cells of the same word line are initially at the state with the lowest (sensing) threshold voltage. At the first stage, the high page data are first programmed to the word line. The flash cells storing bit 1's (of the high page) remain in the same state, but the cells storing bit 0's are programmed forward to (logical) state "0" that has higher threshold voltage. Such a cell distribution is similar to that after the programming of an SLC page. Thus, the programming speed of a high page is very close to that of an SLC page.

At the second stage, the low page data are programmed to the word line to have cells distributed to four different states, so that each cell can represent two bits of data, one from the high page and the other from the low page. The cells in state "1" are programmed forward to state "10" if they store bit 0's of the low page; otherwise, they are programmed to state "11". Similar operations are also applied to the cells in state "0".

The programming algorithm for the second stage requires finer control over the final distribution in threshold voltages. So, programming a low page will take a much longer time than programming a high page. Such a design leads to time-consuming delay on programming low pages, and seriously harms the overall programming speed and access performance in MLC flash memory. In addition, such a design will also result in a larger number of error bits or a higher bit error rate, because the voltage range required for the multiple levels (below Vpass) is partitioned into more states. Note that Vpass is the voltage that can turn on flash cells in any data storage state.

Some MLC programming methods were proposed for the situation that data of both high and low pages are ready in the page buffer at the same time, such as described in U.S. patent application Ser. No. 14/153,934, entitled PROGRAMMING MULTIBIT MEMORY CELLS; by Hsieh et al., filed on 13 Jan. 2014 (now US Pat. Pub. No. 2014/0198570). These can improve performance at the cost of greater constraints on operation of the devices.

It is desirable therefore, to provide improved operating methods for MLC memory, to improve throughput, reduce average latency and improve reliability.

SUMMARY

A technology is provided which includes selecting a program or read operation for an addressed bit in a multi-level cell after at least one other bit has already been programmed in the cell. For example, when programming an addressed bit in a two-bit-per-cell memory, one program operation can be selected for one addressed bit that preserves the other bit, and another program operation can be selected that overwrites the other bit. An operation that overwrites the other bit can be executed with fewer steps or otherwise more quickly than an operation that preserves the other bit. The logic to select one of the selectable program operations can be responsive to a signal that indicates the logical status of the other bit. The logical status of a bit after it has been programmed can change for example, because of memory management algorithms like wear leveling that are executed in a host system.

Other aspects and advantages of the present disclosure can be seen on review of the drawings, the detailed description and the claims, which follow.

BRIEF DESCRIPTION OF THE DRAWINGS

FIG. 2 is a simplified diagram of a block of cells in a NAND flash MLC memory as known in the prior art.

FIG. 3 is a chart showing threshold voltage distributions for program stages in an MLC memory as known in the prior art.

FIG. 9 illustrates pseudocode for a static page allocation embodiment.

FIG. 13 illustrates pseudocode for a dynamic page allocation embodiment.

FIGS. 20-26 are charts showing threshold voltage distributions for program stages in a four-bit-per-cell MLC memory, with various combinations of invalid pages, according to technology described herein.

DETAILED DESCRIPTION

A detailed description of embodiments is provided with reference to the FIGS. 1-26.

Figure 1:
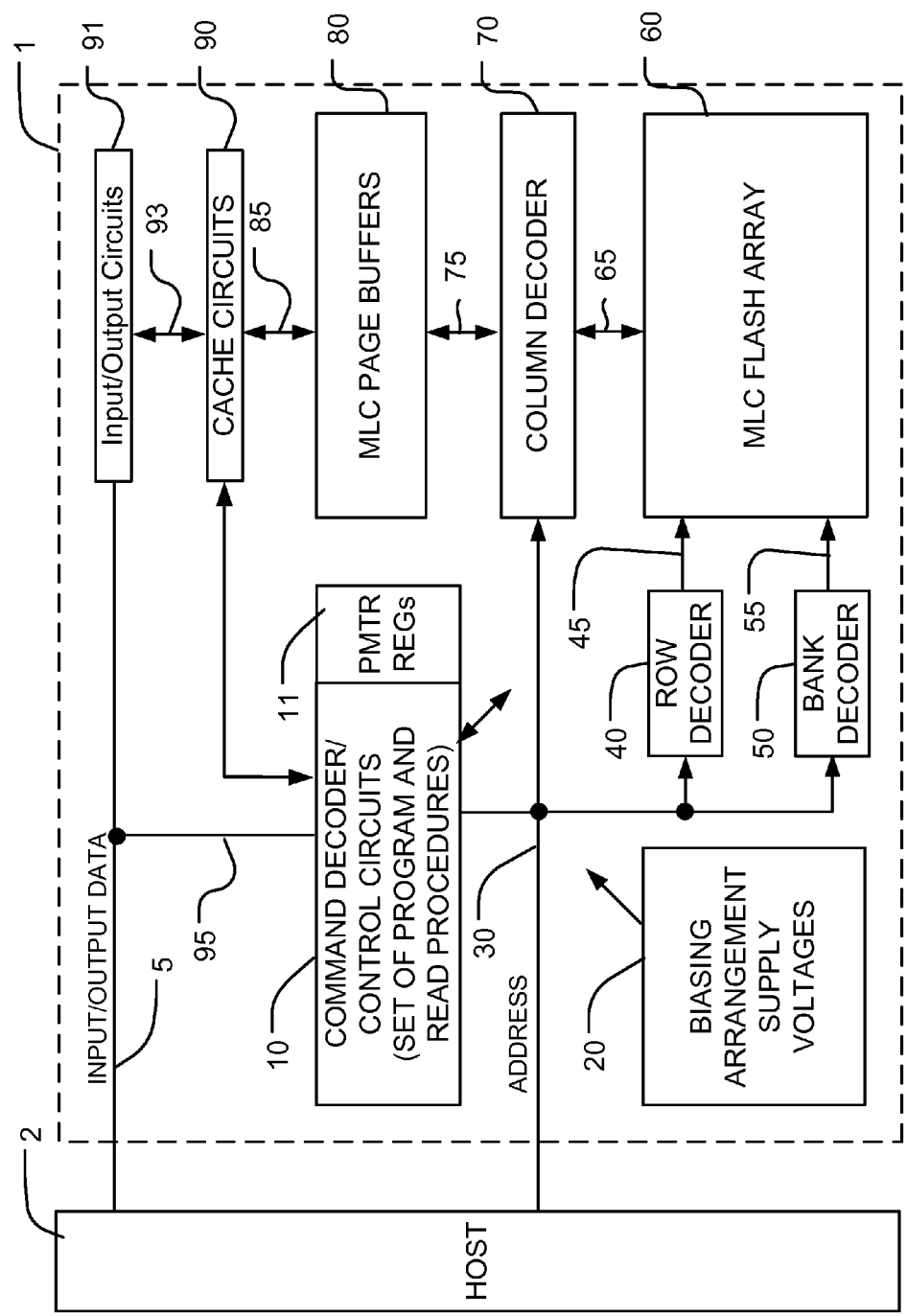
FIG. 1 is a block diagram of a memory system employing multiple-level programming procedures as described herein.

FIG. 1 is a simplified diagram of a memory system including a flash memory device 1 implemented on an integrated circuit and a host 2 configured for multiple-level programming operations, including logic for MLC programming as described herein. The memory device can be implemented on a single integrated circuit chip, on a multichip module, or on a plurality of chips configured as suits a particular need.

The memory device 1 in this example includes a memory array 60 including multiple-level cells MLC that store two or more bits of data per cell, on an integrated circuit substrate. The memory array 60 can be a NAND flash memory implemented using two-dimensional or three-dimensional array technology.

A row decoder 40 is coupled to a plurality of word lines 45, and arranged along rows in the memory array 60. A bank decoder 50 is coupled to a plurality of bank select lines 55 (such as SSL lines and GSL lines). A column decoder 70 is coupled to a plurality of bit lines 65 arranged along columns in the memory array 60 for reading data from and writing data to the memory array 60. A bus including address lines 30 and data lines 5 is illustrated in this example. Addresses are supplied on address lines 30 to circuits 10 implementing a command decoder and controller modules, to column decoder 70, to bank decoder 50 and to row decoder 40. In other examples, an input/output port may be used in which addresses and data may be provided on shared lines in an address/data bus. Also, serial interfaces may be deployed.

MLC page buffer circuits 80 are coupled to the column decoder 70, in this example via first data lines 75. The MLC page buffer circuits 80 can store pages for multiple-level programming, for MLC cells in a block of cells arranged for page programming.

The column decoder 70 can include circuits for selectively applying program and inhibit voltages to bit lines in the memory in response to the data values in the MLC page buffer circuits 80 and control signals that set the program algorithm to be applied.

Sensed data from the MLC page buffer circuits 80 are supplied via second data lines 85 to cache circuits 90, which are in turn coupled to input/output circuits 91 via a data path 93. Also, input data is applied in this example to the cache circuits 90 on lines 93, and to the MLC page buffer circuits 80 on lines 85, for use in support of multiple-level program operations as described herein.

Input/output circuits 91 provide communication paths for the data with destinations external to the memory device 1. Input/output data and control signals are moved via data lines 5 between the input/output circuits 91, the control circuits 10 and input/output ports on the memory device 1 or other data sources internal or external to the memory device 1, such as a general purpose processor or special purpose application circuitry, or a combination of modules providing system-on-a-chip functionality supported by the memory array 60.

In the example shown in FIG. 1, control circuits 10 include control modules implementing a bias arrangement state machine, or machines, which controls, or control, the application of supply voltages generated or provided through the voltage supply or supplies in block 20, such as read, verify and program voltages for a set of selectable program and read operations used in the MLC operating methods described herein.

The control circuits 10 are coupled to the cache circuits 90 and the memory array 60 and other elements of the integrated circuit as needed. The control modules in the circuits 10 include logic to control multiple-level program operations described in more detail below.

The circuits 10 can include modules implemented using special-purpose logic circuitry as known in the art. In alternative embodiments, the circuits 10 can include modules implemented using a general-purpose processor, which can be implemented on the same integrated circuit, which executes a computer program to control the operations of the memory device 1. In yet other embodiments, a combination of special-purpose logic circuitry and a general-purpose processor can be utilized for implementation of modules in circuits 10.

In the illustrated embodiment, a set 11 of parameter registers is included on the memory device 1, and coupled to control modules in the circuits 10. The parameter registers in the set 11 can store parameters for a plurality of selectable program operations and a plurality of selectable read operations, which are selectable according to the processes described herein. For example, the parameter registers can store program verify voltage levels and read voltage levels used in different program and read operations. Also, the parameter registers can store details of program sequences, such as pulse height, pulse width, and pulse magnitude increments, used in programming algorithms such as incremental stepped pulse programming ISPP algorithms.

The memory array 60 can comprise floating gate memory cells or dielectric charge trapping memory cells configured to store multiple bits per cell, by the establishment of multiple program levels that correspond to amounts of charge stored, which in turn establish memory cell threshold voltages VT. The description herein is based on the use of charge trapping memory cells, such as floating gate flash memory and dielectric charge trapping flash memory. The technology can be used with other memory cell technologies. In other examples, the memory cells may comprise programmable resistance memory cells, configured for multiple bits per cell, by the establishment of multiple program levels that correspond to amounts of resistance.

In the illustrated example, the host 2 is coupled to the address lines 30 and data lines 5 on the memory device 1, as well as other control terminals not shown, such as chip select terminals and so on, and can provide commands or instructions to the memory device 1. In some examples, the host 2 can be coupled to the memory device using a serial bus technology, using shared address and data lines. The host 2 can comprise a general purpose processor, a special purpose processor, a processor configured as a memory controller, or other processor that uses the memory device 1. All or part of the host 2 can be implemented on the same integrated circuit as the memory.

The memory can be physically configured into sectors, such that each physical sector is the smallest unit for block erase operations supported by the memory. An erasable block of the memory can correspond for example to one or more physical sectors. For example, each physical sector of the memory can be 16 KB in size. An erasable block of the memory can include one physical sector and have the same 16 KB size as the physical sector. An erasable block of the memory can include 4 physical sectors and have a size of 64 KB. An erasable block of the memory can include 8 physical sectors and have a size of 128 KB.

In memory configured for page mode operations, each erasable block of the memory can include multiple physical pages which include the memory cells accessible in parallel, such as memory cells in a block that share a single word line. Each physical page of memory cells can store multiple logical pages, and can be programmed or read by page program and page read operations supported by the memory. For example, a 2-Gbit multilevel-cell (MLC) NAND flash memory device can include 1K erasable blocks of 128 KiloBytes each in size. Each erasable block can include 64 physical pages of 2 KB each in size, storing two 1 KB logical pages each. Each logical page can include additional storage space (e.g., 64 Byte) for out-of-band OOB metadata, such as error correcting codes, bad block information, erase counters and so on.

Also, each erasable block can include additional storage space (e.g., 4 KB) for OOB used for recording bad pages, erase counters, or other data.

A flash memory can be configured so that a page of the memory can be programmed or read by supplying to the memory a page program or page read command and an address corresponding to the page. Also, the flash memory can be configured so that each block of the memory can be erased by supplying to the memory a block erase command and an address corresponding to the block. For example, each particular page of the example 2-Gbit MLC NAND flash memory device above, can be addressable with a 16-bit address, while the 10 most significant bits of the 16-bit address are the address of the block including the particular page. In this 2-Gbit MLC NAND example, a page can be programmed or read by supplying to the NAND flash memory device a page read or page program command and an address corresponding to the logical page.

The host 2 can include a file system or file systems that store, retrieve, and update data stored in the memory based on requests from an application program. The file system can include a disk file system such as a File Allocation Table (FAT) file system, a Third Extended File System (EXT3), or a New Technology File System (NTFS). The file system can also include a native file system designed for flash memories such as Journaling Flash File System Version 2 (JFFS2), Unsorted Block Image File System (UBIFS), or Yet Another Flash File System (YAFFS). The file system in the host accesses the memory through device drivers such as a read driver (for page read operations), a program driver (for page program operations), and an erase driver (for block erase operations). A software layer such as a Memory Technology Device file can provide an interface between the device drivers and the file system.

In one example, the host 2 includes a Flash Translation Layer module serving as an interface between a disk file system and the device drivers (or the Memory Technology Device files). The Flash Translation Layer can provide memory management operations that perform address translation between logical addresses of the disk file system and addresses of the memory. The Flash Translation Layer can provide memory management operations that include an allocator module that allocates physical memory space in the memory. The Flash Translation Layer can provide memory management operations that include a cleaner module (also called garbage collection) that reclaims physical space in the memory occupied by out-of-date or invalid data. The Flash Translation Layer can provide memory management operations that include a wear-leveler module that performs wear leveling procedures on the memory. Many of these memory management operations can mark data including logical pages of data invalid from time to time, or produce other types of status information usable to select program and read operations for addressed pages.

In general, the host 2 can include programs that perform memory management functions and other functions that can produce status information for data stored in the memory, including information marking data invalid as a result of such functions. Such functions can include for example wear leveling, bad block recovery, power loss recovery, garbage collection, error correction, and so on. Also, the host 2 can include application programs, file systems, flash translation layer programs and other components that can produce status information for data stored in the memory, including information marking data invalid as a result of such functions. In embodiments of the technology described herein, the host 2 includes address mapping logic, mapping logical pages (or other units of data such as bytes, words, sectors or blocks) to corresponding physical pages (or other units of physical cells), and maintaining status information for the logical pages as discussed herein. The technology is described herein with reference to page mode operations to maintain narrative consistency. The technology is extendable to other memory organizations as well, including single cell operations, byte-wide operations and so on.

The host 2 can deliver signals to the memory device 1 on a bus, such as the bus illustrated including the input/output data lines 5, on the address lines 30, and on other signal lines between the devices not shown. In one example, the host 2 delivers status information to the memory device indirectly by providing unique commands to the memory device 1 which identify a program operation or a read operation to be selected from selectable program operations and selectable read operations on the memory device 1. In other embodiments, the host provides a command having an immediate data field that carries information directly or indirectly indicating the status information used for selecting a program operation or a read operation. In other embodiments, the status information may be provided directly to the control circuits on separate lines between the devices. In yet other embodiments, status information may be stored on the memory device 1, and used to generate signals used to select program or read operations.

The command decoder and control circuits 10 are configured to recognize and decode the commands, and to use the status information directly or indirectly in selecting program and read operations.

FIG. 2 illustrates a block of memory cells in a NAND flash array. A block of memory cells such as that illustrated in FIG. 2 can consist of a subarray of memory cells which can be erased as a block, and includes a number of NAND strings (101, 102, 103) which are coupled to corresponding bit lines (Bit Line 1, Bit Line 2, . . . Bit Line M). The M memory cells in a row of the block along a particular word line (e.g. Word Line 2) can be accessed in parallel via the M bit lines coupled with the block, and can be considered for the purposes of this description a physical page of memory cells. For a multilevel memory in which each cell stores two or more bits, each physical page can store two or more logical pages. Thus, for a memory array storing two bits per cell, there can be a first logical page 105 having M bits and a second logical page 106 having M bits stored on the physical page having M cells on Word Line 2. One can refer to the two logical pages as a high page and a low page, where the high page is constrained in driver logic to be the first written page, and the low page is constrained in driver logic to be the second written page. As illustrated in FIG. 2, each logical page can include a combination of data and out-of-band OOB metadata, such as error correcting codes, bad block information, erase counters and so on.

A logical page might be identified by the address bits (AN:A10 and A0) where N+1 is the total number of address bits in this expression, for a memory array capable of sensing in parallel 512 cells (A9:A1) having two bits (A0) each. In this case, a page mode operation can operate on the value of only the addressed bit in the multibit cell, and in the case of a read provide the value of that bit to the page buffer for further processing. One can characterize each cell as storing bits b(n), for n equal to 0 to N−1. One can characterize a physical page as including N logical pages p(n) for n equal to 0 to N−1, and each of the N logical pages includes a bit b(n) from each of the MLC cells in the physical page.

FIG. 3 includes three graphs showing threshold distributions for memory cells in a page according to prior art programming and reading algorithms. The programming operation can proceed using a two-phase process like that shown in FIG. 3, or other types of processes. The two-phase process is described herein to provide background context.

The first graph 120 represents a distribution for a physical page after an erase operation. An erase operation causes the memory cells to adopt a threshold voltage within a range 110. In this case, the logical pages on the physical page are both in an unprogrammed or free state. The second graph 121 represents a distribution for a physical page after an operation to program the high page. In this case, bits in the high page having the "1" state, have a threshold voltage in the range 111, and the bits in the high page having the "0" state, have a threshold voltage in the range 112. This threshold voltage distribution can be implemented using a single level programming operation, such as an ISPP where the program verify voltage level used in a verify step for the program operation lies at the lower edge of the range 112. The third graph 122 represents a distribution for a physical page after an operation to program the low page, following the operation to program the high page. In this case, if the high page bit is "1", then the cell will have a threshold in range 113 or range 114 as determined by the low page bit being "1" or "0", respectively. If the high page bit is "0", then the cell will have a threshold in range 115 or range 116 as determined by the low page bit being "0" or "1", respectively. This threshold voltage distribution can be implemented using a multilevel programming operation such as an ISPP where the program verify voltage levels used in verify steps for the program operation include PV1, PV2 and PV3.

The accuracy of the program operation, and thereby the width of the voltage ranges, are constrained by the need to maintain threshold ranges that fall below a pass voltage Vpass used in a read operation for unselected cells, and to require adequate margin between the ranges.

For an ISPP operation, the accuracy required in the number of threshold voltages utilized for a program verify, requires a lengthy process to successfully establish the desired threshold ranges. Similar conditions consist for read operations, which require the use of multiple threshold voltages to read data from the physical page.

Figure 4:
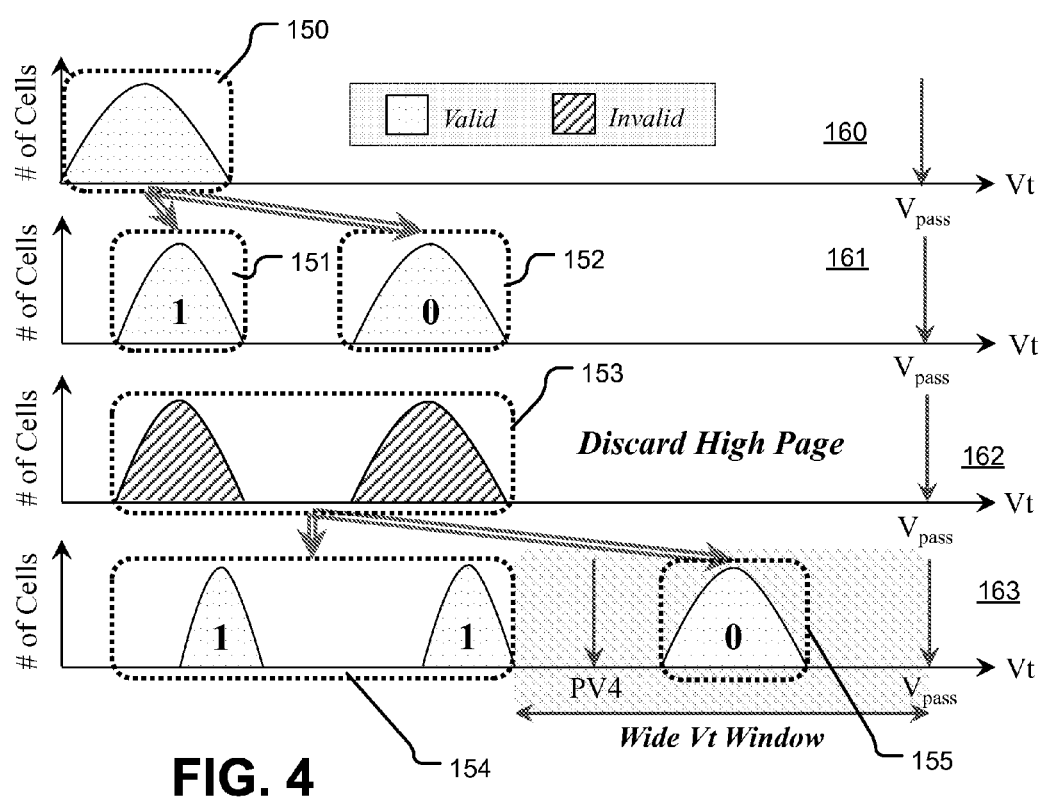
FIG. 4 is a chart showing threshold voltage distributions for program stages in an MLC memory according to technology described herein.

FIG. 4 shows four threshold distribution graphs, illustrating an improved programming algorithm as described herein, which is supported by maintaining status information for the logical pages stored in the physical page. Thus, distributions for valid pages and invalid pages can be identified in the figure; the invalid pages have the cross hatch fill. The first graph 160 represents a distribution for a physical page after an erase operation. An erase operation causes the memory cells to adopt a threshold voltage within a range 150. In this case, the logical pages on the physical page are both in an unprogrammed or free state. The second graph 161 represents a distribution for a physical page after an operation to program the high page. In this case, bits in the high page having the "1" state, have a threshold voltage in the range 151, and the bits in the high page having the "0" state, have a threshold voltage in the range 152. This threshold voltage distribution can be implemented using a single level programming operation, such as an ISPP where the threshold voltage used in a verify step for the program operation lies at the lower edge of the range 152. After the programming of the high page, the high page is marked as "valid" with status information that is used by the system in the read and program operations. The low page can remain marked "free" after the high page programming phase.

The high page will remain marked as "valid" until an event occurs causing the data status to become "invalid". Such events can occur during memory management operations, such as wear leveling operations and the like for flash memory. Thus, a high page marked valid after programming, can become invalid at some time before programming of the low page for the corresponding physical page. This invalid state is represented by the third graph 162, suggesting that the high page can be discarded without loss of valid data. The memory cell storing an invalid high page may still have threshold ranges as illustrated in the region 153.

If a program operation occurs addressing the low page while the high page remains valid, then a multilevel operation like that discussed with reference to FIG. 3 can be utilized. However, if a program operation occurs addressing the low page after the high page becomes marked invalid, then an operation to establish threshold distributions like that shown in the fourth graph 163 can be executed. This program operation can be a single level operation, using a single verify voltage level for the program verify operation, marked PV4 in FIG. 4, or otherwise be a program operation that has fewer steps than (trimmed relative to) the multilevel operation needed for all bits. The status information indicating the type of program operation utilized for, or to be utilized for each low page, can be maintained by a trim bitmap. With the high page marked invalid, only the data for the low page needs to be represented by the threshold distribution. Thus, if the low page bit is "1", the program operation will cause the physical memory cell to have a threshold within the range 154. As illustrated in FIG. 4, this range 154 may include two separate sub ranges which correspond to the ranges induced in programming the high page before it became invalid. If the low page bit is "0", the program operation applying the program verify level PV4 will cause the memory cell to have a threshold within the range 155. This trimmed program operation results in a wide threshold window below the pass voltage Vpass, and provides a substantial reduction in the amount of time required for programming the low page.

The status information in the trim bitmap can be maintained so long as the low page remains valid. Thus, when a read operation is executed addressing the low page, a read threshold can be used between the ranges 154 and 155 for the purposes of reading the bit. This avoids the requirement of multiple read operations using different read voltage levels. Therefore, the amount of time required for reading a low page, in the event that the trimmed program operation had been utilized, is much reduced. Also, a single threshold read operation can be used to read the high bit, so long as the low page remains free.

The use of a single level cell like SLC-like programming algorithm for programming a low page, in the event that the corresponding high page is invalid, provides the ability to provide a wide margin between the ranges of threshold voltages that represent the "1" and the "0" values for the bit. This allows for modifications of the programming algorithm to take advantage of the wide margin, and further reduce programming times.

Figure 5:
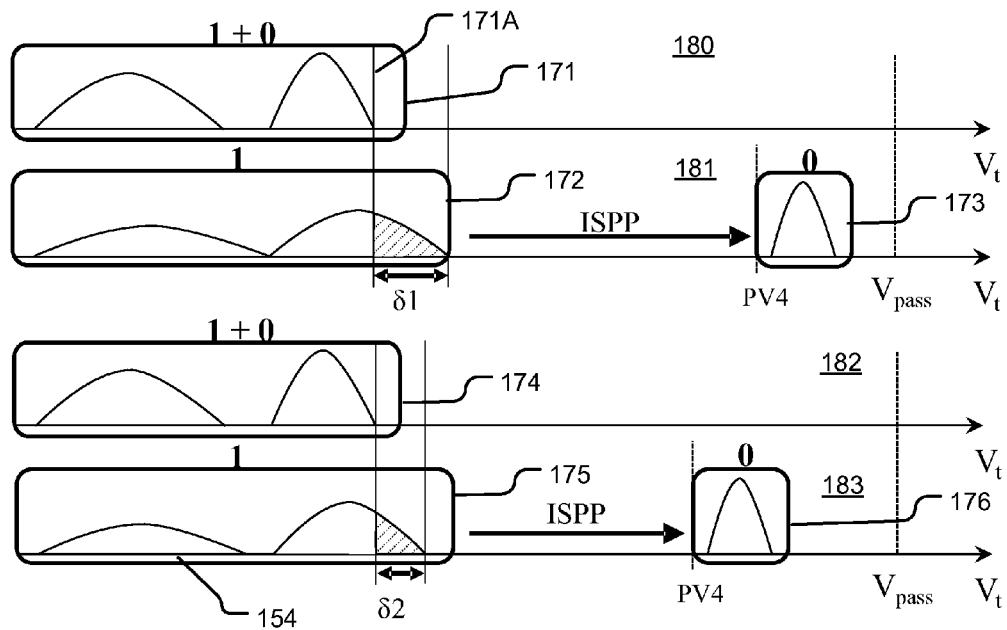
FIG. 5 is a chart showing threshold voltage distributions for program stages in an MLC memory according to technology described herein, where the program stage includes ISPP with variant program verify levels.

For example, as illustrated in FIG. 5, the programming algorithm can be modified by reducing the program verify voltage used. In FIG. 5, a first graph 180 and a second graph 181 illustrate distributions implemented using a single level like ISPP programming operation for the low page, and the event of an invalid high page. The physical page, even though the high page is invalid, can have voltage ranges within the area 171. The high edge of the voltage range is indicated by the line 171A. In the event that the high page becomes invalid, an ISPP program can be executed to establish the ranges 172 and 173 is illustrated in the graph 181. In this sequence, the threshold voltage PV4 is relatively high, such as might be used in a multilevel programming algorithm for the highest bit. As result, a relatively large number of program pulses is executed, causing disturbance of the memory cell storing the bit "1" within the range 172. The disturbance extends the range by the amount 61, which tends to narrow the margin between the range 172 and the range 173.

The graphs 182 and 183 of FIG. 5 illustrate a modification of the ISPP algorithm. Thus, with a starting distribution represented by the range 174 in graph 182, if the high page becomes invalid, a modified ISPP programming algorithm can be executed to establish the ranges 175, 176 shown in graph 183. The modified ISPP programming algorithm can utilize a threshold voltage PV4 which is substantially lower than that used in the process represented by graph 181. In this case, fewer program pulses will be required and disturbance δ2 of the cells having threshold voltages within range 175 will be reduced, relative to the disturbance δ1. This can result in faster operations, with sufficient margins for sensing the data with low error rates.

Figure 6:
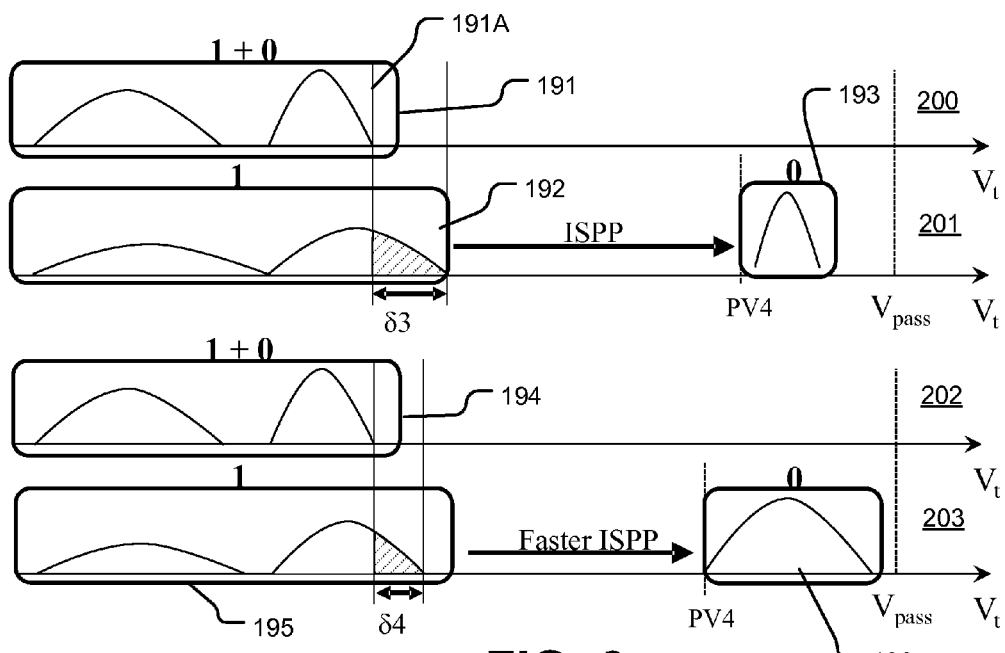
FIG. 6 is a chart showing threshold voltage distributions for program stages in an MLC memory according to technology described herein, where the program stage includes ISPP with variant program pulse increment levels.

Another modification, which can be utilized to take advantage of the wide margin and reduce programming time, is represented by the graphs in FIG. 6. The modification represented by the graphs in FIG. 6 involves utilizing a larger step ΔV in the magnitude of pulses used in the ISPP algorithm. In FIG. 6, a first graph 200 and a second graph 201 illustrate distributions implemented using a single level like ISPP programming operation for the low page, and the event of an invalid high page. The high page, even though it is invalid, can have voltage distributions within the area 191. The high edge of the voltage distributions is indicated by the line 191A. In the event that the high page becomes invalid, an ISPP program can be executed to establish the ranges 192 and 193 as illustrated in the graph 201. In this sequence, the threshold voltage PV4 may be relatively high as discussed with reference to graph 181 of FIG. 5. As result, a disturbance extends the range by the amount 63, which tends to narrow the margin between the range 192 and the range 193.

The graphs 202 and 203 in FIG. 6 illustrate a modification of the ISPP algorithm. Thus with a starting distribution represented by the range 194 in graph 202, if the high page becomes invalid, a modified ISPP programming algorithm can be executed to establish the ranges 195, 196 shown in graph 203. The modified ISPP programming algorithm can utilize a threshold voltage PV4 which is substantially lower than that used in the process represented by graph 201. Also, the program operation can use a larger step ΔV in the magnitude of pulses used in the ISPP algorithm. In this case, fewer program pulses will be required and a disturbance 64 of the cells having threshold voltages within range 195 will be reduced, relative to the disturbance 63. Also, the width of the range 196 will be greater, consuming some of the margin below Vpass, but retaining sufficient margin between the ranges 195 and 196.

Figure 7:
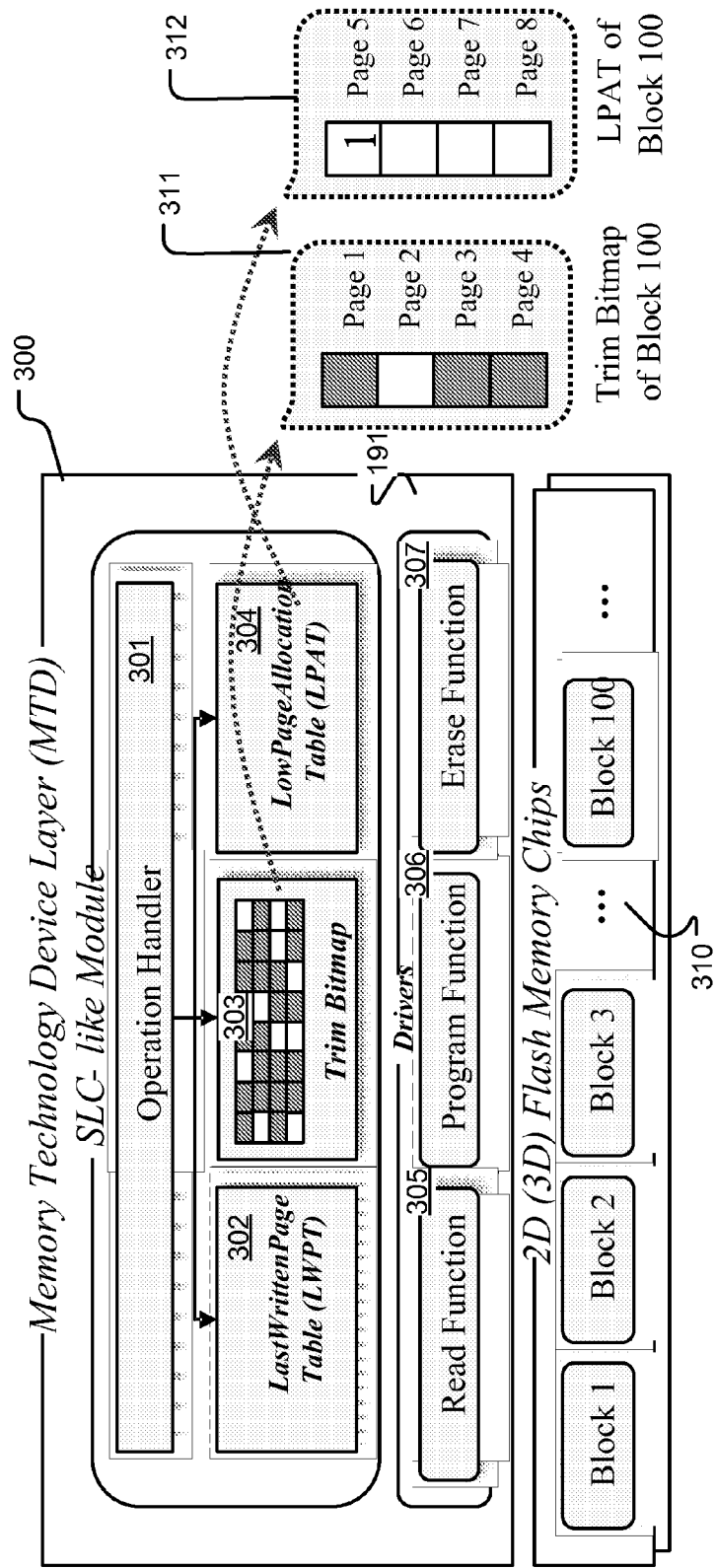
FIG. 7 is a simplified diagram of functional modules implementing a method for operating MLC memory as described herein.

FIG. 7 illustrates modules which can be executed by the host to manage the multilevel programming operations described herein. In this example, modules can be implemented as part of a memory technology device MTD layer module 300 which receives instructions to write data from a higher layer, such as a flash translation layer or other type of file system. Modules include an operation handler 301, which is coupled with status data in addition to higher layer information such as address mapping, data validity, and so on, including a last written page table 302, a trim bitmap 303 (with an example organization shown in region 311), and a low page allocation table 304 (with an example organization shown in region 312). The operation handler 301 communicates with a driver 305 for a read function, a driver 306 for a program function, and a driver 307 for an erase function.

The drivers 305, 306, 307 issue commands or instructions to operate flash memory chips 310, including a plurality of erasable blocks labeled Block 1 through Block 100 in the illustration.

As discussed above, each of the blocks includes a plurality of rows of memory cells where, for a NAND flash, each row coupled to a single word line corresponds to a single physical page which can store a plurality of logical pages.

Figure 8B:
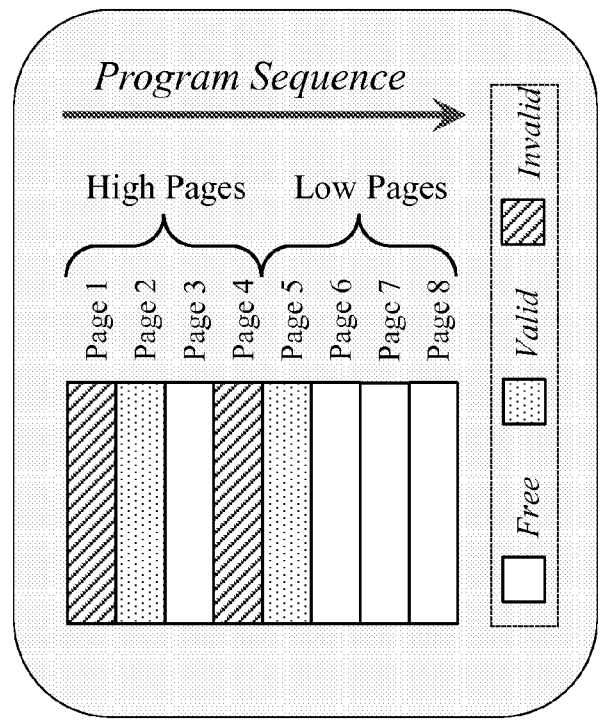
FIGS. 8A and 8B are simplified diagrams of a physical and logical configuration of MLC memory which can be operated using the modules of FIG. 7.
Figure 8A:
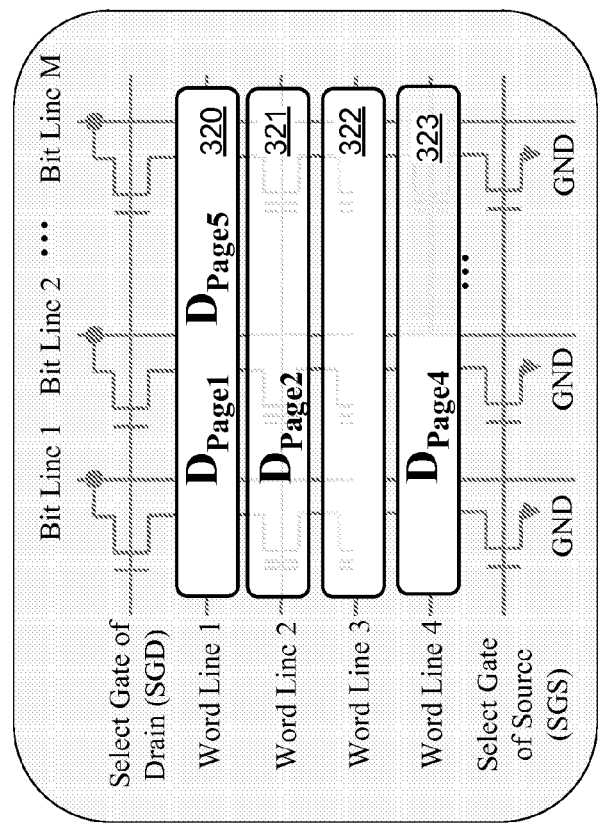

FIG. 8A provides a physical view representation of a NAND flash block including four physical pages 320, 321, 322, 323, each of which has one or more logical pages allocated. In some implementations, each block may have a much larger number of rows or physical pages. This example is described with reference to a block with four physical pages for simplicity.

Physical page 320 is allocated for logical high page 1 and logical low page 5. Physical page 321 is allocated for logical high page 2. Physical page 322 remains in a free status, with no logical page mapped thereto. Physical page 323 is allocated for logical high page 4.

FIG. 8B provides a logical view representation of the block of FIG. 8A. For a block storing two bits per cell, with four physical pages, data for eight logical pages Page 1 to Page 8 can be allocated (DPage1 to DPage8). Status information can be maintained for each of the logical pages, including a valid status which is entered after successfully programming the logical page into the physical page, an invalid status which is entered after a logical page is marked invalid by a memory management routine, and a free status which is entered after successful erase of the block, for example. For the purposes of this explanation, the logical view shows high pages 1 and 4 marked invalid, high page 2 and low page 5 marked valid, and high page 3, low page 6, low page 7 and low page 8 marked free, or unprogrammed.

Also, as indicated in FIG. 8B, the operation handler enforces a program sequence for the logical pages in a block, proceeding from the high pages to the low pages, and stores a last written page table which marks the last written logical page for the block indicating order of programming status of the logical pages in the block.

The trim bitmap 303 has logical organization as illustrated in region 311 of FIG. 7. The operation handler 301 needs to know which high pages have been marked invalid when a program operation is executed to a low page mapped to the same physical page. In the example, as shown in FIG. 8B, page 3 has a "free" status. However, page 4 and page 5 had been programmed out of order. Therefore in this case, page 3 will be treated as if its corresponding high page were invalid, and marked true in the trim bitmap for the block as reflected in the table 311 in FIG. 7.

Also, operation handler 301 needs to know which low pages are mapped to which high page. The mapping can be static, where the low page is statically mapped to the same physical row as a high page having a logical address which is offset by half (for the system having two logical pages per physical page) of the number of logical pages per block. Alternatively, as implemented using a low page allocation table 304, the low pages can be dynamically allocated to physical pages having high pages which are marked invalid at the time of programming. This will increase the number of times that a trimmed program operation can be applied for programming a low page. If at the time low page 5 is to be programmed, high page 1 in the high page of word line 1 remained valid, then the low page 5 could have been allocated using a dynamic allocation scheme to a physical page such as the low page location of word line 2.

The operation handler can be implemented as a module in a memory translation device layer driver, which acts as a hardware abstraction layer for overlying applications. Flash translation layers, or other memory management layers, above the MTD layer can take advantage of the programming methods without modification, or with only limited modification.

The operation handler utilizes the status information stored in the tables 302, 303, 304 to identify a read function, and a program function suitable to the particular logical page being accessed. Information determined and available in the operation handler indicating which read function and which program function to utilize can be passed to the flash memory chips using a command protocol including, for example, a protocol using special commands for each of the different program and read operations, or a command protocol in which the status information is carried with a read command or program command and interpreted at the chip level.

In alternative systems, the operation handler and status information can be maintained on the integrated circuit memory device, and operated locally for the purposes of selecting the appropriate read or program function.

A pseudocode representation of a STATIC OPERATION HANDLER for a two-bit-per-cell memory using static page allocation is shown in FIG. 9. The parameters include the following:
op: request type (read, write, erase, trim).
addr: absolute page address issued by a Flash Translation Layer driver.
data: buffer of page data
bitmap: trim bitmap marking trimmed program operation.
LWPT: Last Written Page Table.

According to the process, an accessed block address pba is determined by dividing a logical addr by the number of logical pages in a block PAGEPERBLOCK (line 1). The number of pages per block can be N times the number of physical pages or rows in an erasable block for a memory in which each cell stores N bits.

An accessed page address ppa is set equal to addr(mod) PAGEPERBLOCK (line 2).

A value offset is determined for accessed block address pba from the LWPT, and indicates the last written page number in the block. (line 3).

Then, for a write operation, the pseudocode determines whether the accessed page address ppa minus the offset is greater than one. If so, then the current operation is a write which skips at least one free page (unprogrammed status). Then the skipped free pages are identified by determining an end point for a trim function to mark high pages among the skipped pages invalid, which end point is the minimum of the accessed page address ppa minus one (ppa−1) (the immediately skipped free page) and one half of the PAGEPERBLOCK minus one (½ PAGEPERBLOCK−1) (the last high page). Then, starting with the skipped page (last written page plus one), the identified free pages are marked as true in the trim bitmap using a TRIM function setting the bits in the bitmap for the accessed block address to indicate whether a trimmed program operation is to be applied, such as an SLC-like operation (lines 4-7).

The trim bitmap then indicates by a "false" marking which high pages in an accessed block are valid, requiring MLC programming for the corresponding low page, and by a "true" marking which high pages are invalid (allowing a trimmed or SLC-like programming for the corresponding low page) for the purposes of the write operation.

As indicated in the pseudocode, the process then determines whether the accessed page address is greater than one half the number of pages per block, indicating that the accessed page address is a low page. In this case, the algorithm determines whether the bitmap is marked for trimmed programming of A low page executing the IS-BIT-SET process, using the bitmap, the accessed block address, and the accessed page address less one half of the number of pages per block (lines 8-9).

If the corresponding entry in the trim bitmap is true, then the process sets an operation selection flag "EnableSLC" to true (line 10) identifying the SLC-like, trimmed process that discards the high page data. Otherwise, the operation selection flag "EnableSLC" to set to false, selecting the multiple level process that preserves the high page data (lines 11-12).

If the accessed page address is a high page, then the operation selection flag is set to false, selecting the normal high page operation, which can be single level operation (lines 13-14).

For a read operation, the pseudocode determines the accessed page address and the accessed block address, and reads the operation selection flag. Then the identified read operation is commanded (lines 15-16).

For a write operation, pseudocode determines the accessed block address, the accessed page address, the data to be written, and the operation selection flag. Then the indicated write operation (i.e. single level program, SLC-like program, multiple level program) is commanded (lines 17-18).

For an erase operation, the pseudocode executes a TRIM operation resetting the trim bitmap and other status information for the accessed block so that each page is indicated as free. Then, the accessed block is erased (lines 19-21).

For a "TRIM" operation, if the value of the accessed page address plus one half the number of pages per block (identifying the corresponding statically mapped high page for an accessed low page), is greater than the address of the last written page as indicated by offset, then the "TRIM" operation sets the bit corresponding to the accessed page address as true (lines 22-24).

Figure 10:
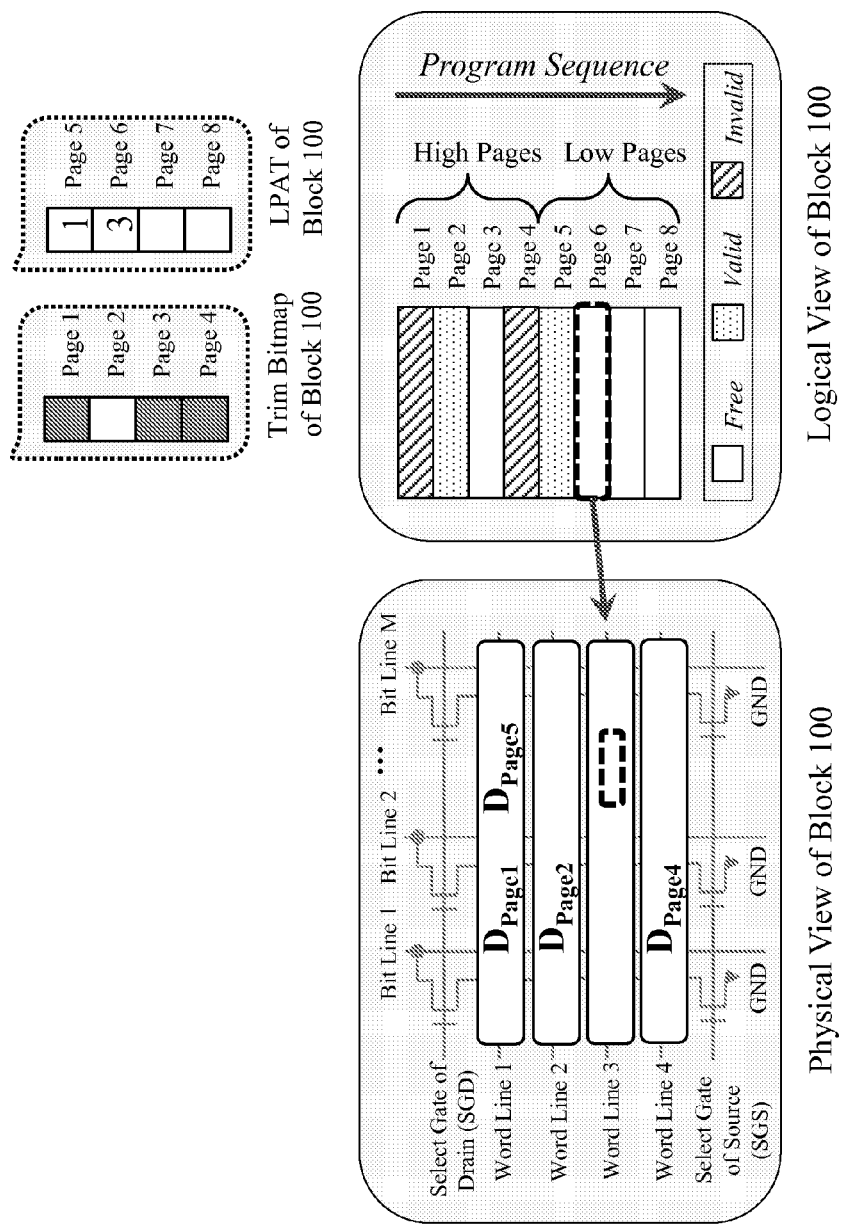
FIGS. 10-12 are a sequence of diagrams in the form of FIGS. 8A-8B, illustrating operating methods as described herein.
Figure 11:
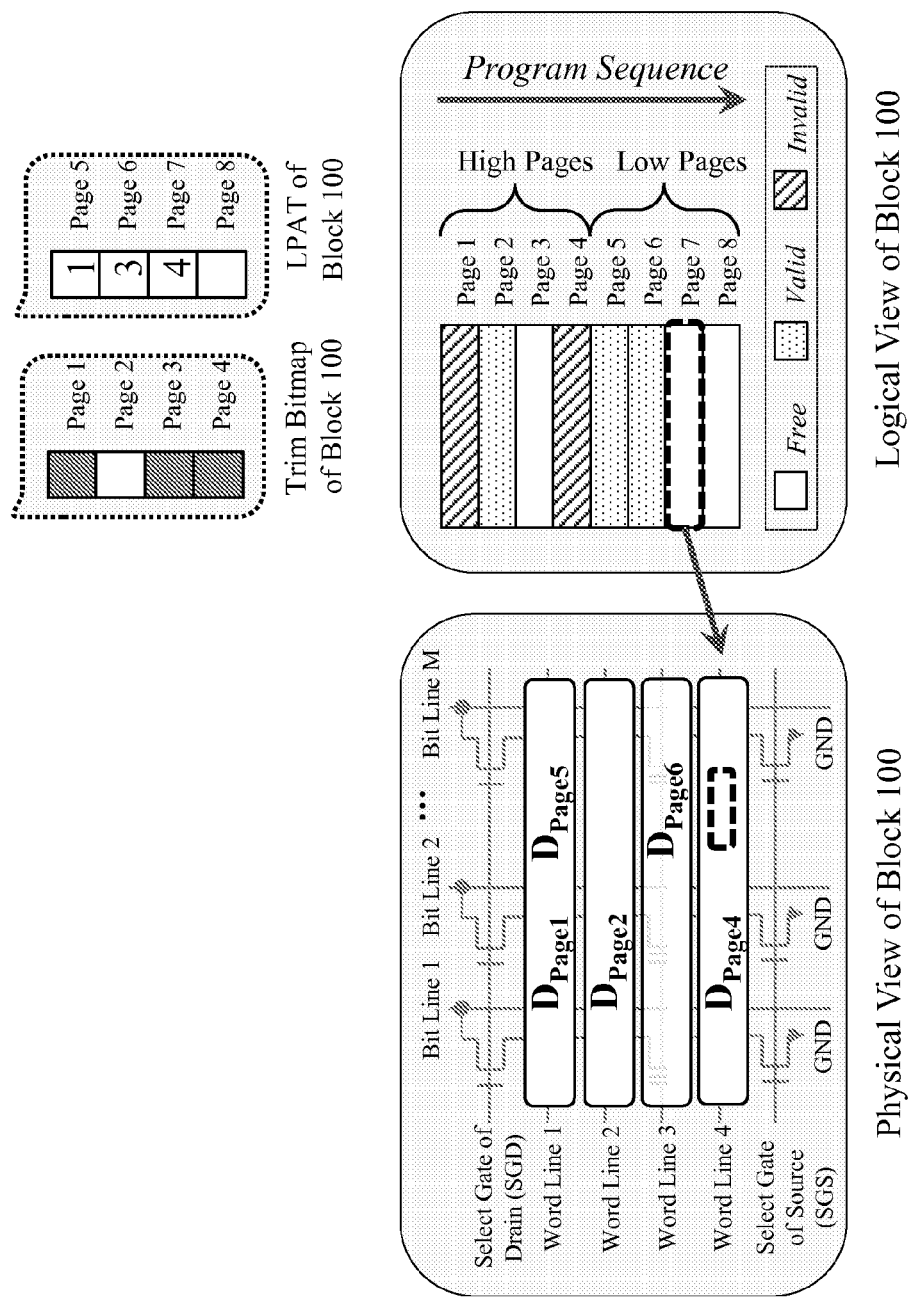
Figure 12:
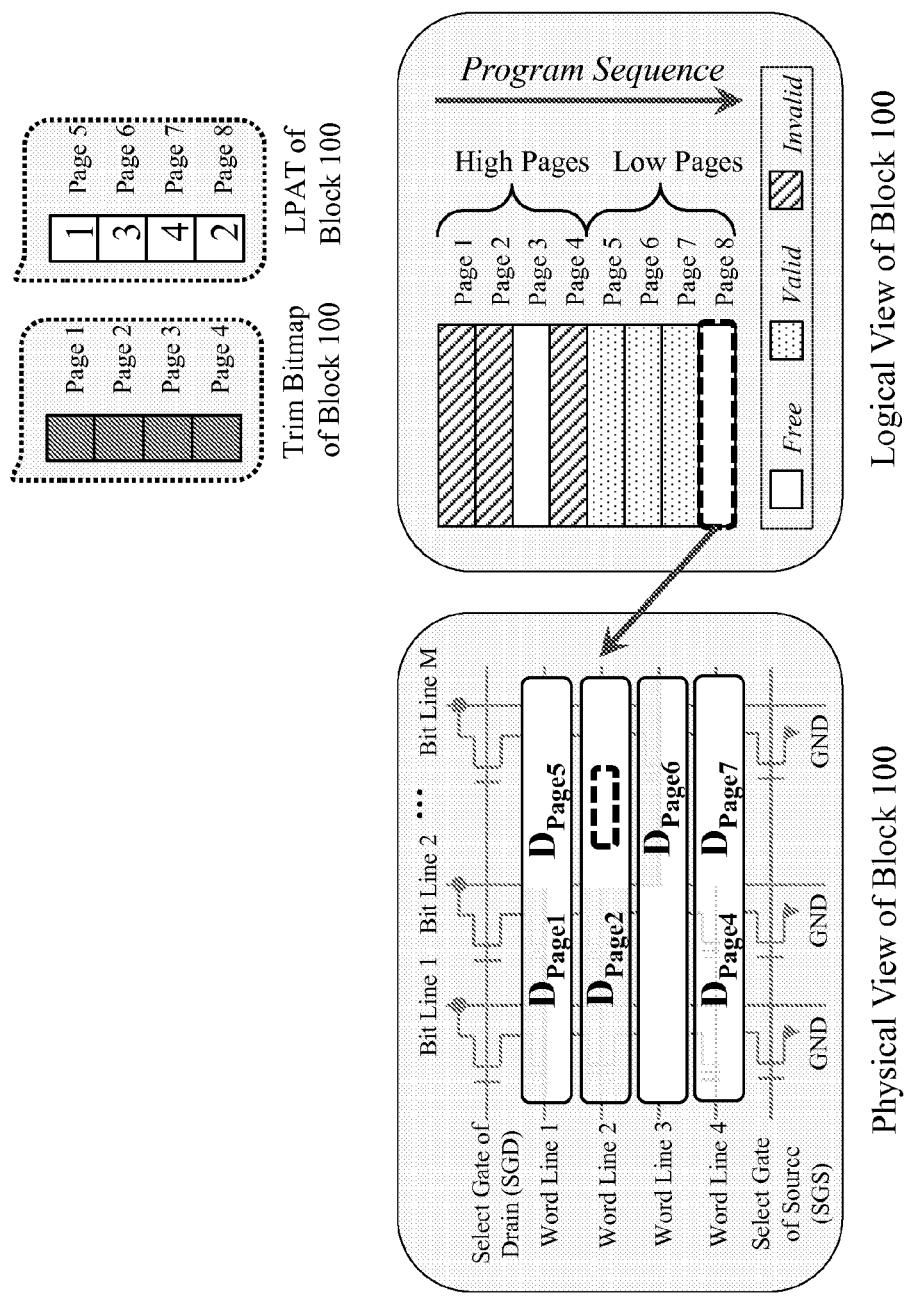

FIGS. 10-12 illustrate a sequence of page program operations to a block such as that represented in FIG. 8A, using a dynamic allocation of low pages. To enhance performance, in operation handler such as that shown FIG. 7 using dynamic allocation will try to program low pages to the physical pages (word lines) with invalid high pages.

FIG. 10 illustrates a process to handle a page write to low page 6 for the block in the condition of FIG. 8A. The data of page 6 are programmed to the low page of the physical page on Word Line 3, instead of Word Line 2 which would be required in a static mapping. This mapping is executed because the high page of Word line 2 contains valid data at the time of the programming operation, and the high page of Word Line 3 is free and is considered an invalid page for the purposes of this algorithm. The low page allocation table is updated by making an entry allocating the low page of word line 3 to high page 6. After the programming, future read operations for data from page 6 read data from the low page of word line 3 according to the information in the low page allocation table.

FIG. 11 illustrates a process for writing low page 7 for the block in the condition of FIG. 10. As before, the operation handler finds a word line with an invalid high page. As result, word line 4 is the best candidate for the data of page 7, because the high page of word line 2 still contains valid data (i.e., DPage2) and the high page (page 4) of word line 4 is invalid. The low page allocation table is updated to map low page of word line 4 to page 7. If the operation handler receives a read operation to read page 7, it will read data from the low page of Word Line 4.

FIG. 12 illustrates a process for writing low page 8 for the block in the condition of FIG. 11, after an update invalidating high page 2. Thus, in the logical view of block 100 and FIG. 11, pages 1, 2 and 4 are marked invalid. Page 8 is allocated to the low page of Word Line 2, and the low page allocation table is updated to indicate the mapping. All of the low pages, page 1 through page 4, are indicated as true in the trim bitmap for block 100 because, as explained above, the free page 3 is treated as an invalid page if a programming operation is applied that skips page 3 and operates out of order.

A pseudocode representation of a DYNAMIC OPERATION HANDLER for a two-bit-per cell memory is shown in FIG. 13. The parameters include the following:

op: request type (read, write, erase, trim).
addr: absolute page address issued by a Flash Translation Layer driver.
data: buffer of page data
bitmap: trim bitmap marking trimmed program operation.
LWPT: Last Written Page Table.
LPAT: Low Page Allocation Table As with the static operation handler, an accessed block address pba is determined by dividing a logical addr by the number of logical pages in a block PAGEPERBLOCK (line 1). Also, an accessed page address ppa is set equal to addr(mod)PAGEPERBLOCK (line 2). A value "offset" is set to the entry in the Last Written Page Table for the accessed block. (Line 3).

If the operation is a write, and the accessed page minus the offset is greater than 1, then the write is occurring out of order. In this case, the entries in the trim bitmap for logical high pages (which are statically allocated) between the last written page and the accessed page need to be set true. Thus, a loop is executed which ends at the minimum of the logical page preceding the accessed page, and the last high page, and which starts at the logical page following the value "offset". This is done by executing the TRIM operation in the bitmap for the accessed block which sets the entry for the physical pages for the skipped high pages to true. (Lines 4-7).

If the accessed page is a low page, then the value "tmp" is set to the value in the entry in the logical page allocation table corresponding to the accessed physical page and accessed block. If there is no entry for the accessed page, then an algorithm is called to allocate the logical page to a corresponding physical page. Otherwise, the accessed page address is set to the entry in the allocation table. (Lines 8-13).

Also for low pages, the process reads the entry in the trim bitmap for the physical page to which the low page is mapped. If it is marked true, then the operation selection flag enableSLC is set true. If it is marked false, the corresponding high page is valid, and the operation selection flag enableSLC is set false. (Lines 14-17).

If the accessed page address is a high page, then the operation selection flag enableSLC is set false. (Lines 18-19).

For a read operation, the accessed page is read using the read algorithm identified by the operation selection flag EnableSLC. (Lines 20-21).

For a write operation, the accessed page is written using the program algorithm identified by the operation selection flag EnableSLC. (Lines 22-23).

For an erase operation, the TRIM algorithm is called to reset the trim bitmap for the accessed block, an algorithm is called to initialize the logical page allocation table for the accessed block, and the block is erased. (Lines 24-27).

If the operation is a TRIM function (line 28), the target page must be a high page. Since there is no need to mark a high page as true in trim bitmap when its corresponding low page has been programmed, the routine calls routines to check the program status of the low page mapped to the same physical page as the high page (i.e., ppa+½ PAGEPERBLOCK). (Lines 29-33). If the routine determines that the low page is not programmed, the corresponding bit in the trim bitmap is set true, indicating that the following access to the corresponding low page should be served with the trimmed functions (lines 34-35). If the low page is programmed based on the LPAT table, then the trim bitmap for the physical page is not changed.

Figure 14:
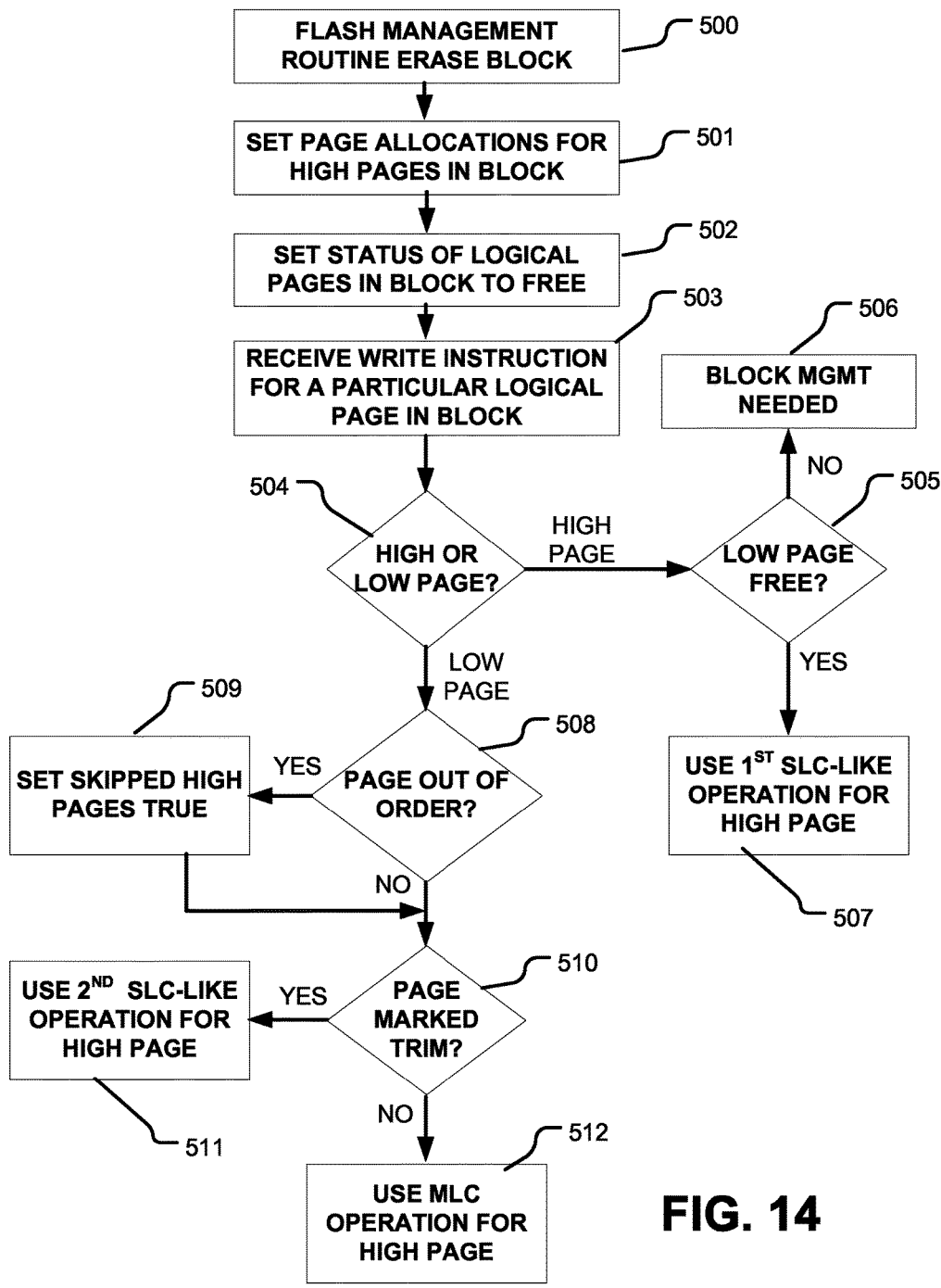
FIG. 14 is a flow chart illustrating program operations for a two-bit-per-cell memory using technology described herein.

FIG. 14 is a flowchart of the basic operating method applying variant program operations for multilevel memory. The illustrated order in the flowchart does not suggest that the steps must be performed in this order. The flowchart starts with a block erase, which is called by a flash management routine for example (500). The page allocations for the high pages in the block are set in the next step (501).

These page allocations can be dynamically set or statically set as discussed above. When statically set, the trim bitmap for a physical page can be mapped to high logical page addresses. Also, the status of logical pages in the block are set to the free status after the erase (502).

According to the operating method, when a write instruction can be received for a particular logical block from a higher level application (503), the process determines whether the page subject of the instruction is a high page or a low page (504). If it is a high page, then the process determines whether the low page remains free (505). If not, then an error has occurred in the order of processing, then the operation can be stopped, and optionally some kind of management of the flash block could be performed (506). If the low page remains free, then a first single level cell-like operation can be identified for writing the high page (507).

If at block 504 it is determined that the target is a low page, then the process determines whether the page is being accessed out of order (508). If it is out of order, then the skipped high pages are set true in trim bitmap (509) after block 509. If it is determined at block 508 that the page is not taken out of order, then the process determines whether the physical page is marked true in trim bitmap (510). If the physical page is true in trim bitmap, then a second single level cell-like operation can be identified for writing the high page (511). If the high page is not marked true in trim bitmap, then a multilevel cell operation is identified to program the low page.

Figure 15:
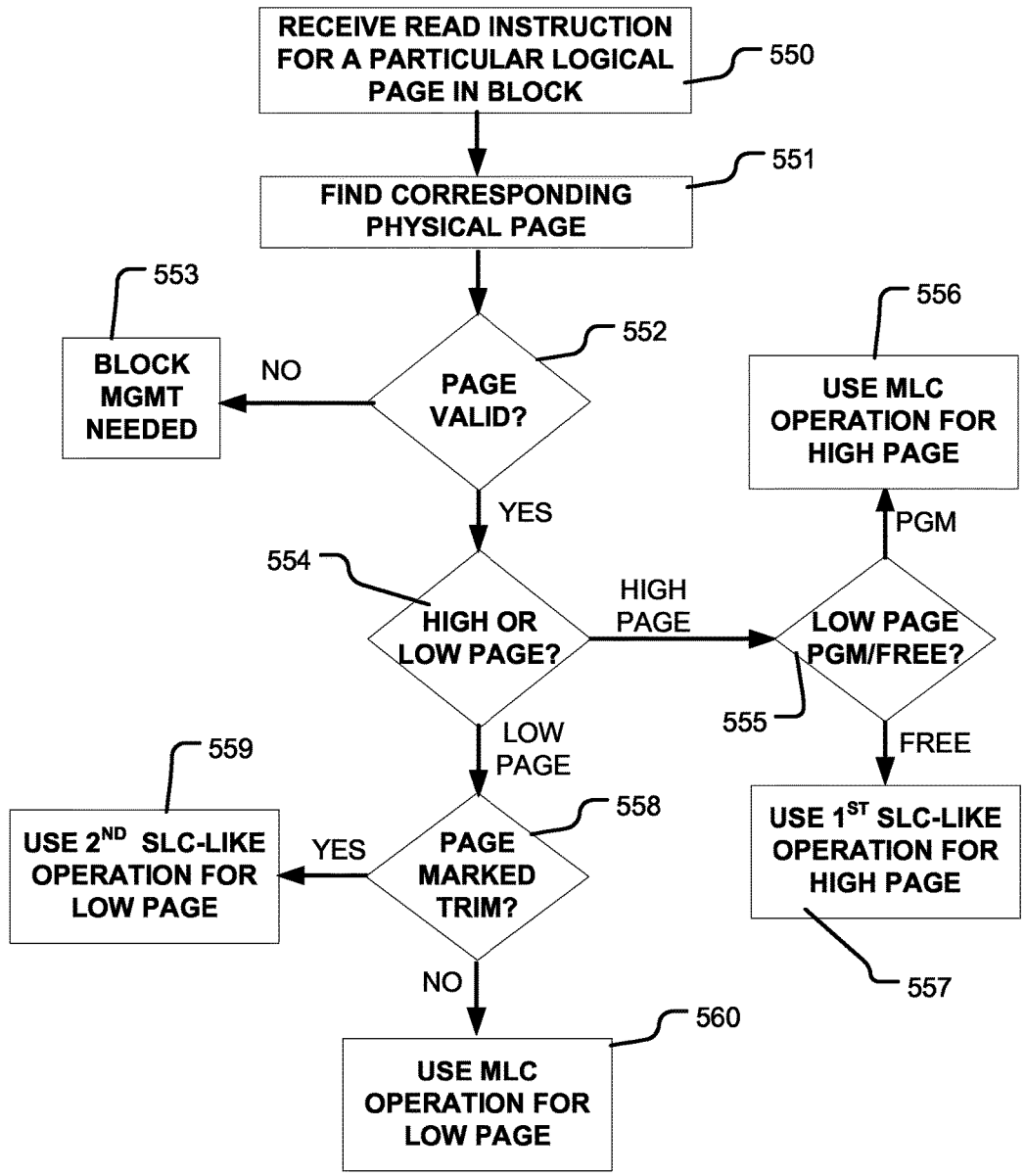
FIG. 15 is a flow chart illustrating read operations for a two-bit-per-cell memory using technology described herein.

FIG. 15 is a simplified flowchart for an operation identifying variant read operations for a multilevel memory. The operation of FIG. 15 starts with receiving a read instruction for a particular logical page in the block (550). The process finds a corresponding physical page using mapping information (551). Next, it is determined whether the page stores valid data (552). If the page is not valid, then block management is needed (553). If the page is valid, then the algorithm determines whether it is a high page or a low page (554).

If it is a high page, then the LPAT is used to identify the low page mapped to the same physical page, and it is determined whether the low page mapped to the same physical page has been programmed, or remains free (555). If the low page has been programmed, then a multilevel cell read operation for the high page is identified (556). If a low page has not been programmed, then a first SLC read operation can be identified for the high page (557).

If at block 554 it is determined that the target is a low page, then the algorithm determines whether the physical page is marked true in trim bitmap indicating availability of SLC-like programming (558). If it is true in trim bitmap, then a second SLC-like read operation can be identified for the low page (559). If at block 558 is determined that the high page is not true in trim bitmap, then the multilevel cell operation is identified for reading the high page (560).

The methods for operating a multilevel cell memory described above have focused on a memory storing two bits per cell, and physical pages storing two logical pages. The technology is extendable to multilevel cells storing more than two bits per cell. Also, the trim bitmap using a single bit per page can be used to select normal or trimmed program and read operations. In other embodiments, more than one trimmed program and more than one trimmed read operation can be applied, and the trim bitmap can store more than one bit per page to identify the correct read and program operations.

Figure 16:
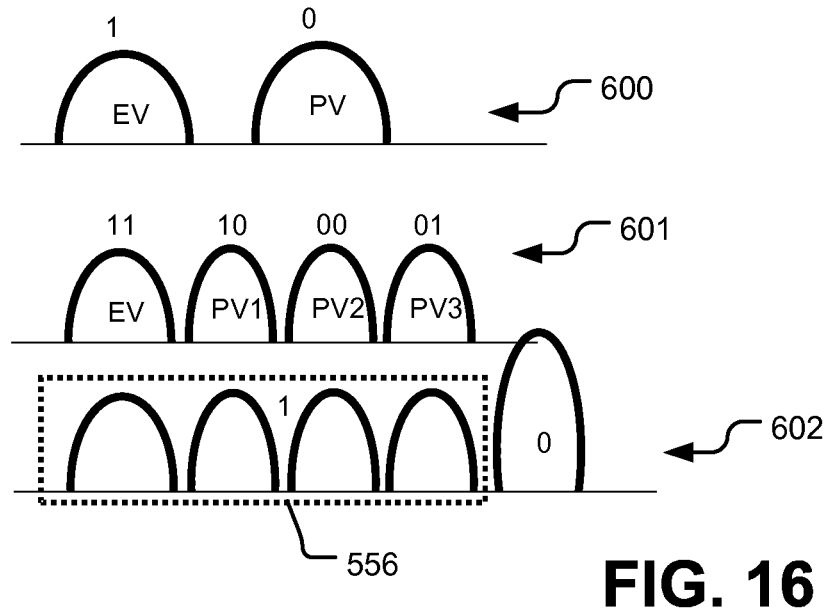
FIGS. 16-18 are charts showing threshold voltage distributions for program stages in a three-bit-per-cell MLC memory, with various combinations of invalid pages, according to technology described herein.
Figure 17:
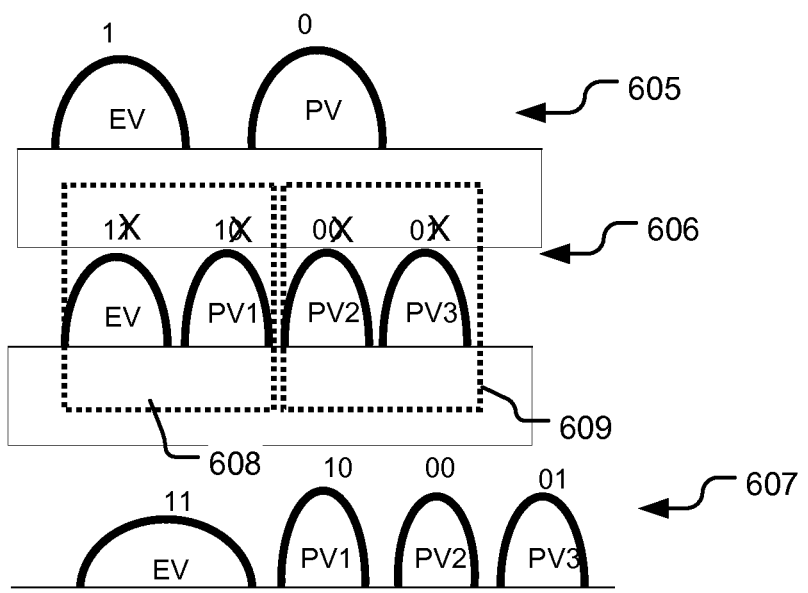
Figure 18:
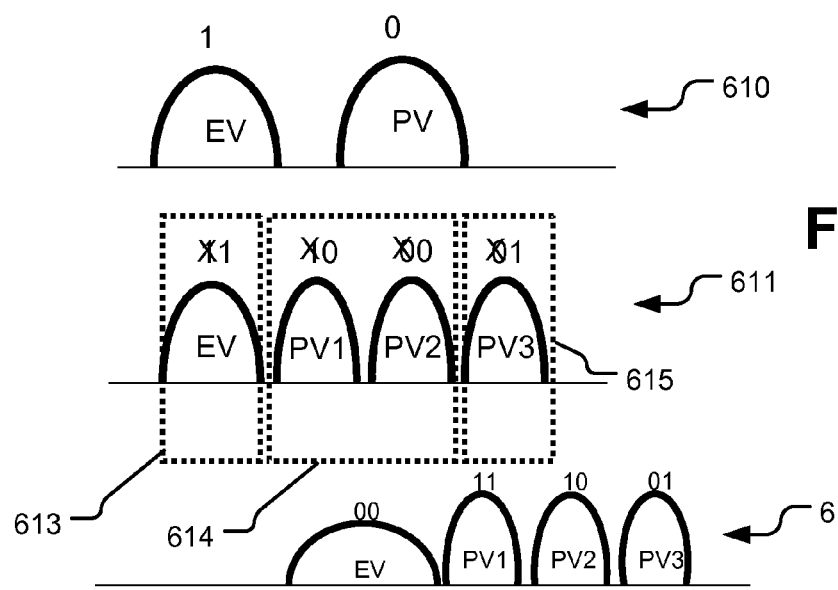

FIGS. 16-18 illustrate selectable program operations for three-bit-per-cell memories according to the technology described herein. A multilevel cell program or read for three logical pages per physical page requires the ability to sense eight different data values in each cell. This requires the memory device to support selectable program and read operations that utilize seven sensing threshold values when all three logical pages store valid data. A memory device can be configured to support all of the program operations illustrated, and to select the appropriate operation in response to a signal that indicates, directly or indirectly, the status of the data as explained above. The memory cell in the example of FIGS. 16-18 has three addressable bits b(0), b(1) and b(2), and the addressed bit is bit b(0) (or addressable pages). Logic on the memory device selects a program operation to be applied from among a plurality of variant program operations including the first and second program operations and a third program operation, wherein:

the first program operation overwrites programmed bits (b(1) and b(2)) (or pages), the second program operation preserves the other bits (b(1) and b(2) (or pages), and the third program operation overwrites one (e.g., b(1)) of the other bits and preserves another (e.g., b(2)) of the other bits (or pages).

FIG. 16 includes three graphs showing threshold voltage distributions for a three-bit-per-cell memory which is configured for using a single level cell-like operation for a low page in the event that the high and middle pages for the three-bit-per-cell system are invalid. Thus, in programming a high page, a single level cell-like operation is used to establish the distribution shown in graph 600, which can be accomplished using a single verify voltage level for program verify. To program the middle page, a multilevel cell operation is used to establish the distribution shown in graph 601, which can be accomplished using three verify voltage levels to define for distributions corresponding to the possible combinations for the high and middle pages. When programming the low page, if the high and middle pages are invalid, an algorithm can be used to establish the distribution shown in graph 602. The algorithm used to establish distribution shown in graph 602 can be a single level cell-like algorithm using a single verify voltage level for program verify.

Thus, if the memory cell stores a "1" in the low page, and the high and middle pages are invalid, then the threshold voltage of the cell will lie in the distribution shown in region 556. If the memory cell stores a "0" in the low page, and the high and middle pages are invalid, then the threshold voltage of the cell lies in the distribution marked with the "0" in graph 602.

FIG. 17 includes three graphs showing threshold voltage distributions for a three-bit-per-cell memory which is configured using a two-bit-per-cell-like operation for the low page in the event that the middle page becomes invalid while the high page remains valid. Thus, to program the high page, an algorithm is used to establish distribution shown in graph 605 which can use a single verify voltage level for program verify. To program the middle page, an algorithm is used to establish the distribution shown in graph 606 which can use three verify voltage levels for program verify. If the middle page becomes invalid subsequently, as indicated by the cross-out of the data bit on the graph 606, then the value of the high page remains represented by cells having the threshold distributions within the ranges 608 and 609. An algorithm can be used to program the low page to establish the distribution shown in the graph 607 which can use three verify voltage levels for program verify, while retaining the data values for the high page and the low page.

FIG. 18 includes three graphs showing threshold voltage distributions for a three-bit-per-cell memory which is configured using a two-bit-per-cell-like operation for the low page in the event that the high page becomes invalid while the middle page remains valid. Thus, to program the high page, an algorithm is used to establish a distribution shown in the graph 610, which can use a single verify voltage level for program verify. To program the middle page, an algorithm is used to establish the distribution shown in graph 611, which can use three verify voltage levels for program verify. If the high page becomes invalid subsequently, as indicated by the cross-out of the data bit on the graph 611, then the value of the middle page remains represented by the cells having the threshold distributions within the ranges 613, 615 for the bit "1", and the range 614 for the bit "0". An algorithm can be used to program the low page to establish the distribution shown in the graph 612, which can use three verify voltage levels for program verify, while retaining the data values for the middle page and the low page.

FIGS. 19-25 illustrate programming operations for four-bit-per-cell memory according to the technology described herein. A multilevel cell program or read for four logical pages per physical page requires the ability to sense 16 different data values in each cell. This requires program and read operations that utilize 15 verify voltage levels when all four logical pages store valid data. Logic on the memory device selects a program operation to be applied from among a plurality of variant program operations four addressable bits b(0), b(1), b(2) and b(3), and the addressed bit is bit b(0) (or four addressable pages). Logic on the device selects the operation from among a plurality of variant program operations including the first, second, third fourth program operations, wherein the first program operation overwrites all of the other bits (b(1), b(2) and b(3)) (or pages), the second program operation preserves all of the other bits (b(1), b(2) and b(3)) (or pages), the third program operation overwrites one (e.g., b(1)) of the other bits and preserves two of the other bits (e.g., b(2) and b(3)) (or pages), and the fourth program operation overwrites two of the other bits (e.g., b(1) and b(2)) and preserves one of the other bits (e.g., b(3)) (or pages).

Figure 19:
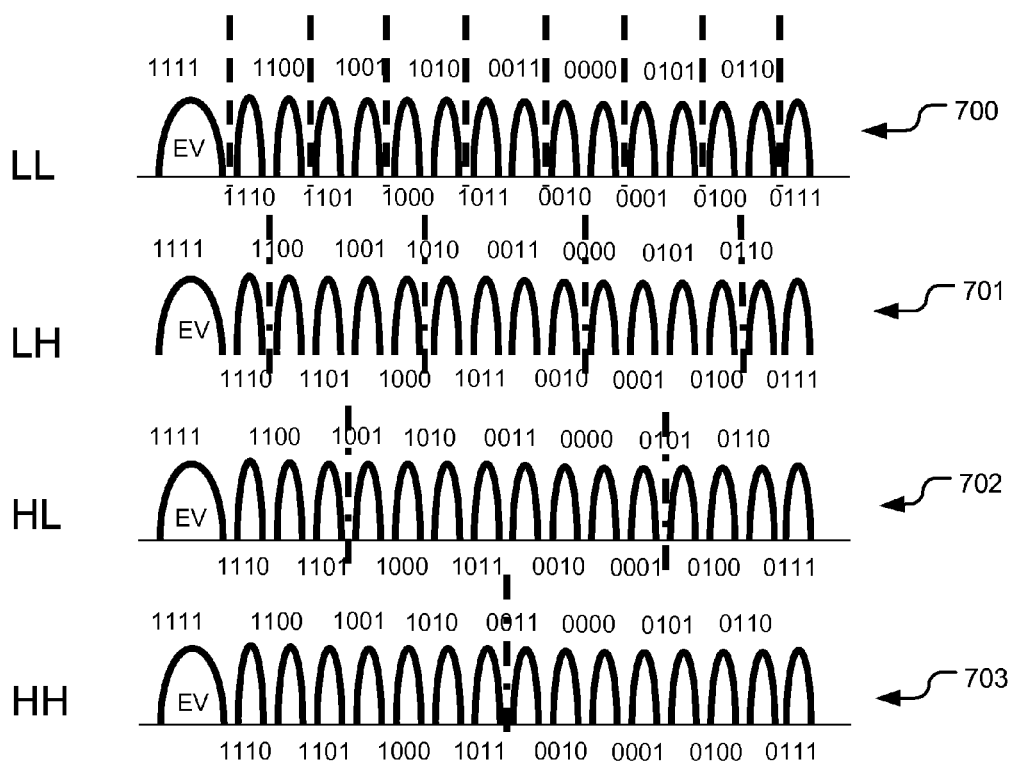
FIG. 19 is a chart showing threshold voltage distributions for program stages in a four-bit-per-cell MLC memory, and illustrating a page naming convention used here.

FIG. 19 illustrates the verify voltage levels used for a four-bit-per-cell memory, and provides a page naming convention used in the present description. The page naming convention defines a page LL (graph 700) as a low page, a page LH (graph 701) as a second intermediate page, a page HL (graph 702) as a first intermediate page, and a page HH (graph 703) as a high page.

The data values can be configured as shown in the graph so that the sensing of the page HH can be accomplished using a single verify voltage level as shown in graph 703, between the distributions representing 1011 and 0011. The sensing of the page HL can be accomplished using two verify voltage levels as shown in the graph 702, between the distributions representing 1101 and 1001, and between the distributions representing 0001 and 0101. The sensing of the page LH can be accomplished using four verify voltage levels shown in the graph 701, between the distributions representing 1110 and 1100, between the distributions representing 1000 and 1010, between the distributions representing 0010 and 0000, and between the distributions representing 0100 and 0110. Finally, the sensing of the page LL can be accomplished using eight verify voltage levels shown in graph 700, (level 1) between the distributions representing 1111 and 1110, (level 2) between the distributions representing 1100 and 1101, (level 3) between the distributions representing 1001 and 1000, (level 4) between the distributions representing 1010 and 1011, (level 5) between the distributions representing 0011 and 0010, (level 6) between the distributions representing 0000 and 0001, (level 7) between the distributions representing 0101 and 0100, and (level 8) between the distributions representing 0110 and 0111.

Figure 20:
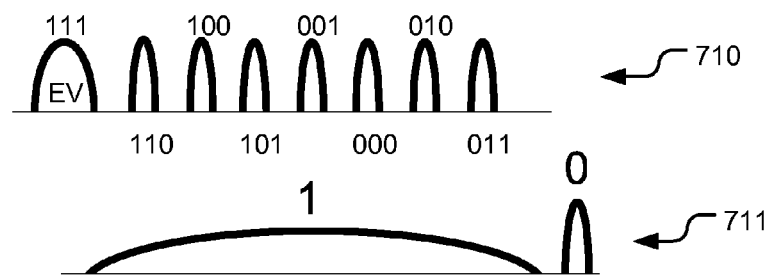

FIG. 20 includes two graphs showing threshold voltage distributions for a four-bit-per-cell memory. First graph 710 shows the distributions after programming pages HH, HL and LH. This results in memory cells in the page having threshold voltages within the eight ranges illustrated storing three valid bits per cell. When programming the low page LL, if all three of the HH, HL and LH pages become invalid, then a programming operation can be applied to implement the distribution shown in the graph 711, using a single verify voltage level.

Figure 21:
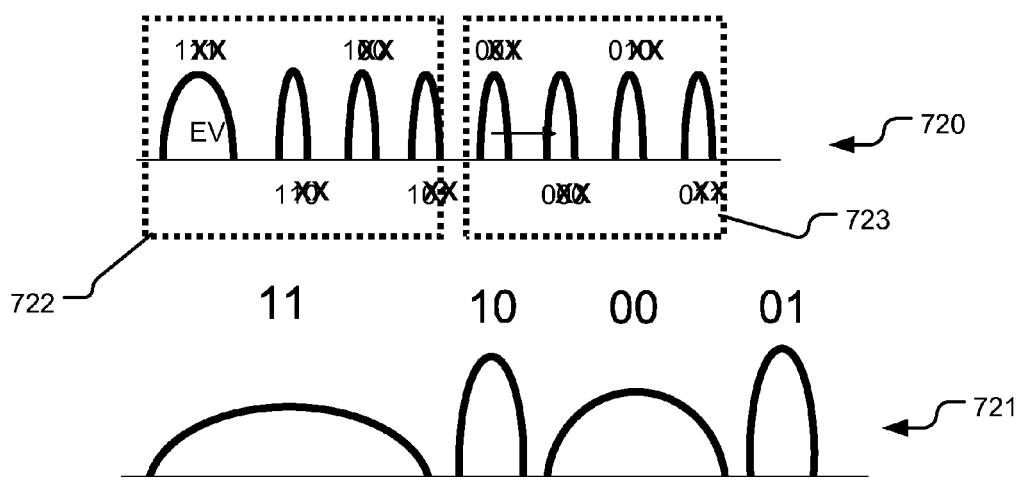

FIG. 21 includes graphs showing threshold voltage distributions for a four-bit-per-cell memory. The first graph 720 shows the distributions after programming pages HH, HL and LH. This results in memory cells in the page having threshold voltages within the eight ranges illustrated storing three valid bits per cell. If the intermediate pages HL and LH become invalid as indicated by the cross-outs of the data bits in the figure, then the information of the high page HH is maintained in the distributions 722 and 723. To program the low page LL, a program operation can be used to establish the threshold distribution shown in the graph 721, using three verify voltage levels, while preserving the data values for the high page HH and overwriting or discarding the invalid data for the intermediate pages HL and LH. In the distribution on graph 721 of FIG. 21, the high page HH can be sensed using a single verify voltage level. The low page LL can be sensed using two verify voltage levels.

Figure 22:
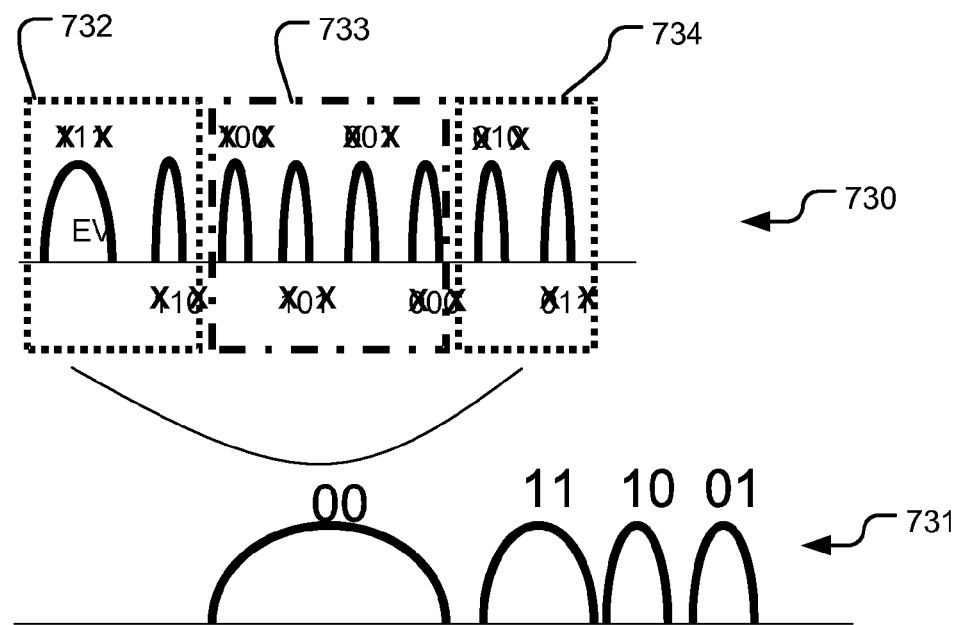

FIG. 22 includes graphs showing threshold voltage distributions for a four-bit-per-cell memory. The first graph 730 shows the distributions after programming pages HH, HL and LH. This results in memory cells in the page having threshold voltages within the eight ranges illustrated storing three valid bits per cell. If the high page HH and second intermediate page LH become invalid as indicated by the cross-outs of the data bits in the figure, then the information of the first intermediate page HL is maintained in the distributions 732 and 734 for this bit "1", and in distribution 733 for the bit "0". To program the low page LL, a program operation can be used to establish the threshold distribution shown in the graph 731, using three verify voltage levels, while preserving the data values for the first intermediate page HL and overwriting the invalid data for the high and second intermediate pages HH and LH. In the distribution on graph 731 of FIG. 22, the first intermediate page HL can be sensed using three verify voltage levels. The low page LL can be sensed using two verify voltage levels.

FIG. 23 includes graphs showing threshold voltage distributions for a four-bit-per-cell memory. The first graph 740 shows the distributions after programming pages HH, HL and LH. This results in memory cells in the page having threshold voltages within the eight ranges illustrated storing three valid bits per cell. If the high page HH and first intermediate page HL become invalid as indicated by the cross-outs of the data bits in the figure, then the information of the second intermediate page LH is maintained in the distributions 742, 744 and 746 for the bit "1", and in distributions 743 and 745 for the bit "0". To program the low page LL, a program operation can be used to establish the threshold distribution shown in the graph 741, using three verify voltage levels, while preserving the data values for the second intermediate page LH and discarding the invalid data for the high and first intermediate pages HH and HL. In the distribution on graph 741 of FIG. 23, the second intermediate page LH can be sensed using two verify voltage levels. The low page LL can be sensed using three verify voltage levels.

FIG. 24 includes graphs showing threshold voltage distributions for a four-bit-per-cell memory. The first graph 750 shows the distributions after programming pages HH, HL and LH. This results in memory cells in the page having threshold voltages within the eight ranges illustrated storing three valid bits per cell. If the second intermediate page LH becomes invalid as indicated by the cross-outs of the data bits in the figure, then the information of the high page HH and first intermediate page HL are maintained in the distributions 752 through 755. To program the low page LL, a program operation can be used to establish the threshold distribution shown in the graph 751, using seven verify voltage levels, while preserving the data values for the high page HH and first intermediate page HL and discarding the invalid data for the second intermediate page. In the distribution on graph 751 of FIG. 23, the high page HH can be sensed using a single verify voltage level, the first intermediate page HL can be sensed using two verify voltage levels, and the low page can be sensed using four verify voltage levels.

Figure 25:
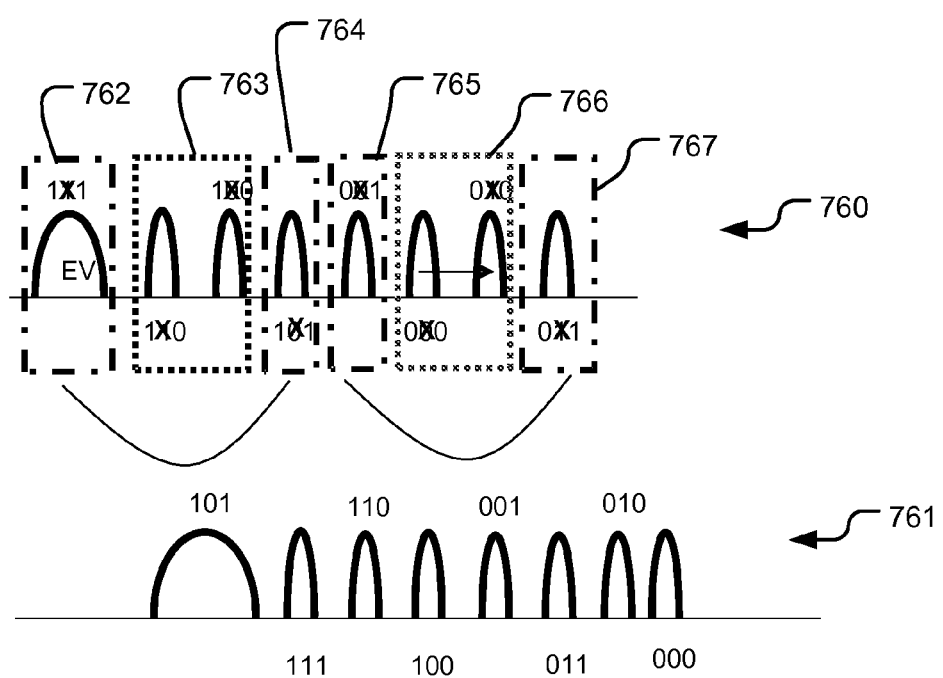

FIG. 25 includes graphs showing threshold voltage distributions for a four-bit-per-cell memory. The first graph 760 shows the distributions after programming pages HH, HL and LH. This results in memory cells in the page having threshold voltages within the eight ranges illustrated storing three valid bits per cell. If the first intermediate page HL becomes invalid as indicated by the cross-outs of the data bits in the figure, then the information of the high page HH and second intermediate page LH are maintained in the distributions 762 through 767. To program the low page LL, a program operation can be used to establish the threshold distribution shown in the graph 761, using seven verify voltage levels, while preserving the data values for the high page HH and second intermediate page LH, and overwriting the invalid data for the first intermediate page HL. In the distribution on graph 761 of FIG. 25, the high page HH can be sensed using a single verify voltage level, the first intermediate page LH can be sensed using four verify voltage levels, and the low page can be sensed using four verify voltage levels.

Figure 26:
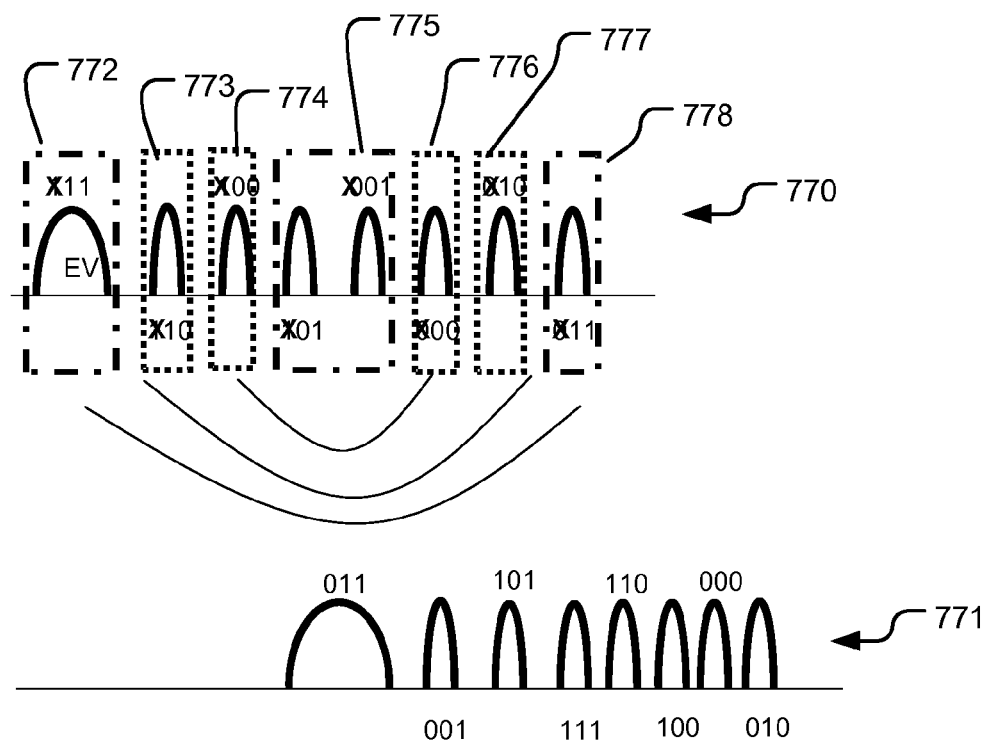

FIG. 26 includes graphs showing threshold voltage distributions for a four-bit-per-cell memory. The first graph 770 shows the distributions after programming pages HH, HL and LH. This results in memory cells in the page having threshold voltages within the eight ranges illustrated storing three valid bits per cell. If the high page HH becomes invalid as indicated by the cross-outs of the data bits in the figure, then the information of the first intermediate page HL and second intermediate page LH are maintained in the distributions 772 through 778. To program the low page LL, a program operation can be used to establish the threshold distribution shown in the graph 771, using seven verify voltage levels, while preserving the data values for the first intermediate page HL and second intermediate page LH and overwriting the invalid data for the high page HH. In the distribution on graph 771 of FIG. 26, the first intermediate page HL can be sensed using two verify voltage levels, the second intermediate page LH can be sensed using four verify voltage levels, and the low page can be sensed using one verify voltage level.

Thus, a method of operating multiple-bit-per-cell memory is described which can improve the throughput and reliability of the data stored. The operation method has been described with reference to a page mode device. It applies as well on a cell-by-cell level, and to other organizations of memory cells.

From the point of view of operating a multiple-bit-per-cell memory, for a single memory cell storing a number of addressable bit b(n) for n equal to 0 through N−1, and where N is at least 2, the method can include responding to an instruction addressing a particular one of the bits in the memory cell by determining an operation to apply in response to the validity of another bit in the cell. The operation to apply is selected from a plurality of variant operations to form the command. The operation can select an operation to perform the command that utilizes the smallest number of verify voltage levels for the programming or reading operations. Method can include maintaining a map indicating validity of bits in the cell, and selecting the operation in response to the map. The operation can be a program command or a read command for a particular bit.

In general, in response to a program command addressing a particular bit, on a condition including another bit in the cell being invalid, the operating method can signal execution of a first program operation, else signal execution of a different program operation in the plurality of variant operations. The first program operation can include program verify steps for a first number of program verify voltage levels and the different program operation can include program verify steps for a second number of program verify voltage levels, where the first number is less than the second number.

Likewise, in response to a read command addressing a particular bit, on condition that another bit in the cell is invalid, in a first read operation can be selected else, a second read operation can be selected. The first read operation can include a read step or steps for a first number of read voltage levels, while the second read operation includes read steps for a second number of read voltage levels, where the first and second numbers are different.

The technology described herein is able to exploit system knowledge from a logical layer to determine data valid parameters for the logical pages on each physical page. This information can then be used to tailor the programming and reading operations to optimize system performance.

Operations described herein can be implemented as a software or firmware level as suits a particular application. For example, software in a host system can be utilized to support the processes described herein. Also, firmware or software in a memory controller device coupled which as part of a host system can be utilized to support the processes described herein. Also, software or firmware on the memory device itself can be used to support the processes described herein.

The technology described herein can effectively improve access performance and reliability. It can be applied to flash memory storage systems configured for mass storage, and for other flash memory applications.

The technology described herein provides larger threshold voltage windows like that found in single level cell memories in certain conditions based on the status of logical pages stored in multilevel pages. Program latency can be reduced. Read latency can be reduced, and bit error rate can be reduced.

One objective achieved by this technology is to reduce long latency required for programming low pages and multilevel cells as much as possible, and to effectively increase the overall reliability of multilevel cell pages. Technology described herein combines system knowledge with processes utilized for programming and reading at the chip level to improve system performance.

While the present technology is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the technology and the scope of the following claims.

The invention claimed is:

1. A multiple-bit-per-cell memory, comprising:
   a memory cell having at least two addressable bits;
   logic to execute a plurality of selectable program operations to store a program data value for a selected addressable bit of the at least two addressable bits of the memory cell when the memory cell has an initial threshold within a range representing a data value previously stored in an unselected one of the addressable bits, the plurality of selectable program operations including:
   a first program operation which establishes a first target threshold within a first range which represents the program data value for the selected addressable bit, and which does not represent any data value for the unselected one of the addressable bits of the memory cell; and
   a second program operation which establishes a second target threshold within a second range which represents the program data value for the selected addressable bit and the data value previously stored for the unselected one of the addressable bits; and
   logic to select one of the selectable program operations.

2. The memory of claim 1, wherein the first program operation uses a first number of verify voltage levels and the second program operation uses a second number of verify voltage levels, the first number being smaller than the second number.

3. The memory of claim 1, wherein the logic to select one of the selectable program operations is responsive to a signal that indicates a logical status of the unselected one of the addressable bits.

4. The memory of claim 1, wherein the logic to select one of the selectable program operations comprises a command decoder.

5. The memory of claim 1, including logic to read the selected addressable bit using a read operation that corresponds with the selected one of the selectable program operations.

6. The memory of claim 1, including logic to read the selected addressable bit using a read operation selected in response to a logical status of the unselected one of the addressable bits.

7. The memory of claim 1, including:
   logic to execute a plurality of selectable read operations to read a selected addressable bit of the memory cell; and
   logic to select one of the selectable read operations.

8. The memory of claim 1, wherein the memory cell has three addressable bits b(0), b(1) and b(2), and the selected addressable bit is bit b(0), and the plurality of selectable program operations includes the first and second program operations and a third program operation which establishes a third target threshold, wherein:
   the first target threshold does not represent any data value for the unselected bits (b(1) and b(2));
   the second target threshold which represents the program data value for the selected addressable bit and represents data values previously stored for the unselected bits (b(1) and b(2)); and
   the third target threshold which represents the program data value for the selected addressable bit, does not represent any data value for one (e.g., b(1)) of the unselected bits and represents a data value previously stored for one (e.g., b(2)) of the unselected bits.

9. The memory of claim 1, wherein the memory cell has four addressable bits b(0), b(1), b(2) and b(3), and the selected addressable bit is bit b(0), and the plurality of selectable program operations includes the first and second program operations, a third program operation which establishes a third target threshold, and a fourth program operation which establishes a fourth target threshold, wherein:
   the first target threshold does not represent any data value for any of the unselected bits (b(1), b(2) and b(3));
   the second target threshold which represents the program data value for the selected addressable bit and represents data values previously stored for all the unselected bits (b(1), b(2) and b(3));
   the third target threshold which represents the program data value for the selected addressable bit, does not represent any data value for one (e.g., b(1)) of the unselected bits and represents data values previously stored for two of the unselected bits (e.g., b(2) and b(3)); and
   the fourth target threshold which represents the program data value for the selected addressable bit, does not represent any data value for two of the unselected bits (e.g., b(1) and b(2)) and represents a data value previously stored for one of the unselected bits (e.g., b(3)).

10. The memory of claim 1, wherein the memory cell is a member of a page of cells having multiple addressable pages, each addressable bit of memory cells in the page of cells being a member of a corresponding addressable page, and the logic to select one of the selectable program operations uses a signal that indicates a logical status of the addressable page corresponding to the unselected bit.

11. A method of operating a multiple-bit-per-cell memory, comprising:
    for a memory cell having at least two addressable bits;
    selecting one of a first program operation and a second program operation to store a program data value for a selected addressable bit of the at least two addressable bits of the memory cell when the memory cell has an initial threshold within a range representing a data value previously stored in an unselected one of the addressable bits, where the first program operation establishes a first target threshold within a first range which represents the program data value for the selected addressable bit, and which does not represent any data value for the unselected one of the addressable bits, and the second program operation establishes a second target threshold within a second range which represents the program data value for the selected addressable bit and the data value previously stored for the unselected one of the addressable bits; and
    executing the selected one of the first and second program operations.

12. The method of claim 11, wherein the first program operation uses a first number of verify voltage levels and the second program operation uses a second number of verify voltage levels, the first number being smaller than the second number.

13. The method of claim 11, including selecting one of the first and second program operations using a signal that indicates a logical status of the unselected one of the addressable bits.

14. The method of claim 11, wherein the cell stores more than two addressable bits, and said selecting includes selecting from among a plurality of variant program operations including the first and second program operations.

15. The method of claim 14, wherein the plurality of variant operations to perform the command have steps applying different numbers of verify voltage levels.

16. The method of claim 11, including reading the selected addressable bit using a read operation that corresponds with the selected one of the first and second program operations.

17. The method of claim 16, wherein said reading includes selecting a first read operation, else selecting a second read operation, wherein the first read operation includes a read step or steps for a first number of read voltage levels, and the second read operation includes read steps for a second number read voltage levels, and the first number is less than the second number.

18. The method of claim 11, wherein the memory cell has three addressable bits b(0), b(1) and b(2), and the selected addressable bit is bit b(0); and
said selecting includes selecting from among a plurality of variant program operations including the first and second program operations and a third program operation which establishes a third target threshold, wherein:
the first target threshold does not represent any data value for bits (b(1) and b(2));
the second target threshold represents the program data value for the selected addressable bit and represents data values previously stored for unselected bits (b(1) and b(2)); and
the third target threshold represents the program data value for the selected addressable bit, does not represent any data value for one (e.g., b(1)) of the unselected bits and represents a data value previously stored for another (e.g., b(2)) of the unselected bits.

19. The method of claim 11, wherein the memory cell has four addressable bits b(0), b(1), b(2) and b(3), and the selected addressable bit is bit b(0); and
said selecting includes selecting from among a plurality of variant program operations including the first and second program operations, a third program operation which establishes a third target threshold, and a fourth program operation which establishes a fourth target threshold, wherein:
the first target threshold does not represent any data value for bits (b(1), b(2) and b(3));
the second target threshold represents the program data value for the selected addressable bit and represents data values previously stored for all of the unselected bits (b(1), b(2) and b(3));
the third target threshold represents the program data value for the selected addressable bit, does not represent any data value for one (e.g., b(1)) of the unselected bits and represents data values previously stored for two of the unselected bits (e.g., b(2) and b(3)); and
the fourth target threshold represents the program data value for the selected addressable bit, does not represent any data value for two of the unselected bits (e.g., b(1) and b(2)) and represents a data value previously stored for one of the unselected bits (e.g., b(3)).

20. The method of claim 11, wherein the memory cell is a member of a page of cells having multiple addressable pages, each addressable bit of memory cells in the page of cells being a member of a corresponding addressable page; and
including selecting the one of the first and second program operations using a signal that indicates a logical status of the corresponding addressable page of the unselected addressable bit in the memory cell.

21. A multiple-bit-per-cell, page mode memory, comprising:
a plurality of physical pages, each physical page having N addressable pages p(n), for n equal to 0 through N−1;
logic implementing a plurality of selectable page program operations to program a data page to a selected addressable page of the N addressable pages in an addressed physical page; and
logic to select one of the plurality of selectable program operations to program the data page to the selected addressable page of the addressed physical page using a signal that indicates a logical status of previously programmed data in an unselected addressable page of the N addressable pages in the addressed physical page, the plurality of selectable program operations including a first program operation and a second program operation, wherein:
the first program operation establishes first threshold values in the addressed physical page which represent the data page for the selected addressable page and which do not represent any data for the unselected addressable page; and
the second program operation establishes second threshold values in the addressed physical page which represent the data page and the previously programmed data in the unselected addressable page.

22. The memory of claim 21, wherein the first program operation uses a first number of verify voltage levels and the second program operation uses a second number of verify voltage levels, the first number being smaller than the second number.

23. The memory of claim 21, wherein the logic to select one of the plurality of selectable program operations receives said signal from an external source.

24. The memory of claim 21, including logic to read the addressed page using a read operation selected using a signal indicating a logical status of the other addressable page.

25. The memory of claim 21, wherein the physical page has three addressable pages p(0), p(1) and p(2), and the selected addressable page is page p(0); and
said logic to select selects from among a plurality of variant program operations including the first and second program operations and a third program operation, wherein:
the first threshold values represent data values for page p(0), and do not represent any data values for addressable pages (p(1) and p(2));
the second threshold values represent data values for page p(0), and for the addressable pages (p(1) and p(2)); and
the third threshold values represent data values for page p(0), and for page p(2), and do not represent data values for page p(1)).

26. The memory of claim 21, wherein the memory cell has four addressable pages p(0), p(1), p(2) and p(3), and the addressed page is page p(0); and said logic to select selects from among a plurality of variant program operations including the first and second program operations, a third program operation which establishes third threshold values, and a fourth program operation which establishes fourth threshold values, and in which:

the first threshold values represent data values for page p(0), and do not represent any data values for the other addressable pages (p(1), p(2) and p(3));

the second threshold values represent data values for page p(0), and for the other addressable pages (p(1), p(2) and p(3));

the third threshold values represent data values for page p(0) and for two of the other addressable pages, and do not represent any data values for one (e.g., p(1)) of the addressable pages; and the fourth threshold values represent data values for page p(0) and for one of the other addressable pages, and do not represent any data values for two of the addressable pages (e.g., p(1) and p(2)).

27. The memory of claim 21, wherein the logic to select comprises a command decoder.

28. The memory of claim 21, wherein the first and second program operations include respective incremental stepped pulse programming ISPP algorithms which differ in a magnitude of change in pulse height during the ISPP.

29. The memory of claim 21, wherein the first and second program operations include respective incremental stepped pulse programming ISPP algorithms which differ in a magnitude of a verify voltage level during the ISPP.

* * * * *